(12) United States Patent
Jungwirth et al.

(10) Patent No.: US 12,438,550 B2
(45) Date of Patent: Oct. 7, 2025

(54) CONTINUOUS TIME SIGNAL PROCESSING SYSTEMS AND SUBSYSTEMS

(71) Applicant: U.S. Army DEVCOM, Army Research Laboratory, Adelphi, MD (US)

(72) Inventors: Patrick W. Jungwirth, Bel Air, MD (US); W. Michael Crowe, Madison, AL (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 222 days.

(21) Appl. No.: 18/129,114

(22) Filed: Mar. 31, 2023

(65) Prior Publication Data
US 2023/0412185 A1      Dec. 21, 2023

Related U.S. Application Data

(60) Provisional application No. 63/353,038, filed on Jun. 17, 2022.

(51) Int. Cl.
*H03M 1/38* (2006.01)
*H03M 1/12* (2006.01)

(52) U.S. Cl.
CPC .......... *H03M 1/125* (2013.01); *H03M 1/122* (2013.01)

(58) Field of Classification Search
CPC .... H03M 1/167; H03M 1/0695; H03M 1/164; H03M 1/44; H03M 1/168; H03M 1/365; H03M 1/361; H03M 1/1009; H03M 1/12; H03M 1/1023; H03M 1/1033; H03M 1/069; H03M 1/165; H03M 1/0607
USPC ................ 341/155, 161, 162, 154
See application file for complete search history.

(56) References Cited

U.S. PATENT DOCUMENTS

| | | | |
|---|---|---|---|
| 6,366,230 B1 * | 4/2002 | Zhang ................ | H03M 1/167 341/161 |
| 6,369,744 B1 * | 4/2002 | Chuang .............. | H03M 1/0695 341/161 |
| 6,384,757 B1 * | 5/2002 | Kosonen ............ | H03M 1/1038 341/120 |
| 6,563,445 B1 * | 5/2003 | Sabouri .............. | H03M 1/1061 341/161 |
| 6,570,523 B1 * | 5/2003 | Bacrania ............ | H03M 1/165 341/154 |
| 6,882,292 B1 * | 4/2005 | Bardsley ............ | H03M 1/1061 341/155 |

(Continued)

*Primary Examiner* — Linh V Nguyen
(74) *Attorney, Agent, or Firm* — Alan I. Kalb

(57) ABSTRACT

Continuous time pipeline, level-crossing (LC), analog-to-digital converters (ADCs) use a plurality of stages from a first stage to a last stage. Each stage has an array of comparators that are provided with an array of reference voltage levels. Each stage is configured to detect level crossings of increasing fineness compared to the preceding stage such that the accuracy of a digitized representation of an input signal can be increased by adding stages as well as increasing the number of comparators in each stage. The voltage error in the digitized representation of the signal that remains after each stage provides the input to the subsequent stage. The continuous time pipeline LC ADCs are also applied to analog signal processing and software defined radios.

4 Claims, 22 Drawing Sheets

(56) References Cited

U.S. PATENT DOCUMENTS

| | | | | |
|---|---|---|---|---|
| 7,187,610 | B1* | 3/2007 | McCollum | G11C 11/404 |
| | | | | 365/189.11 |
| 7,522,085 | B1* | 4/2009 | Srinvasa | H03M 1/0624 |
| | | | | 341/161 |
| 8,325,865 | B1* | 12/2012 | Rofougaran | H04B 1/001 |
| | | | | 375/350 |
| 8,344,920 | B1* | 1/2013 | Hernes | H03M 1/1057 |
| | | | | 375/345 |
| 9,467,161 | B1* | 10/2016 | Kim | H03M 1/145 |
| 9,843,337 | B1* | 12/2017 | Li | H03M 1/1009 |
| 2006/0025099 | A1* | 2/2006 | Jung | H03D 7/166 |
| | | | | 455/313 |
| 2008/0074301 | A1* | 3/2008 | Ueno | H03M 1/1235 |
| | | | | 341/155 |

\* cited by examiner

CONTINUOUS TIME SIGNAL PROCESSING SYSTEMS AND SUBSYSTEMS

CROSS-REFERENCE TO RELATED APPLICATIONS

This application claims benefit to U.S. Provisional Patent Application Ser. No. 63/353,038, filed Jun. 17, 2022 and entitled "Continuous Time Pipeline Level Crossing ADC and Continuous Time Software Reconfigurable Radio Architecture," which is hereby incorporated by reference herein in its entirety.

GOVERNMENT INTEREST

The embodiments herein may be manufactured, used, and/or licensed by or for the United States Government without the payment of royalties thereon.

BACKGROUND

Technical Field

The embodiments herein generally relate to continuous time signal processing systems including signal processing, data sampling, analog-to-digital converters, software defined radio architectures and neural networks.

Description of the Related Art

Conventional digital signal processing systems are based on discrete time (or space) and suffer from limitations imposed by Shannon's sampling theorem. Conventional digital signal processing (DSP) samples and processes data every T seconds (every clock cycle). Conventional signal processing systems encompass digital signal processing, charge coupled devices, analog-to-digital converters, software defined radios and other discrete time (space) based signal processing systems.

Conventional DSP does not take into account the signal activity to minimize the number of samples. For example, an electrocardiogram (ECG) signal has near zero slope regions and high slope pulse regions. For conventional DSP, samples are measured every T seconds, and the signal activity is not taken into account. Adaptive sampling significantly lowers the number of sample data points and saves energy.

Conventional neural networks or deep neural networks are built using discrete time (space) blocks. Conventional neural networks suffer from very large networks of nodes performing simple math operations. Since discrete time does not take into account the signal activity, high signal processing activity is required all the time.

Conventional pipeline analog-to-digital converters suffer from multiple simultaneous state changes. Conventional sampling systems are limited by frequency aliasing and aliased noise. Conventional software defined radios are limited by analog nonlinearities and by performance limitations of conventional analog-to-digital converters.

Conventional pipeline analog-to-digital converters suffer from (1) overlapping pipeline stage voltage levels, (2) multiple voltage reference stages, (2) multiple bit changes in multiple pipeline stages, and (4) complex amplitude and timing error correction. Conventional pipeline analog-to-digital converters are not designed to guarantee only one state change occurs a time.

Current continuous time, flash, level crossing analog-to-digital converters suffer from exponential growth just like a conventional flash analog-to-digital converter.

Conventional sample data systems are limited by aliased noise. Aliased noise can be from discrete spatial sampling or discrete time sampling. CCD cameras sample in the spatial domain followed by a conventional discrete time analog-to-digital converter (discrete time sampling).

Conventional software defined radios (SDR) or software reconfigurable radios (SRR) are limited by analog signal processing. Conventional SDRs can be divided into two classes: (1) analog signal processing front end, or (2) preamplifier directly connected to a wide band analog-to-digital converter. Analog signal processing front end mixer (multiplier) suffers from nonlinearities and intermodulation distortion. Intermodulation distortion is problematic for SDRs. For strong signals, intermodulation distortion power increases as two times the input signal's linear power or 3 times log power in dBm or dBW. For type (1) SDRs, the nonlinearities of the mixer stage are a major drawback. For type (2) SDRs, the SDRs suffer from limited dynamic range and pipeline ADC issues as described above.

The need remains for effective SDR architectures that (1) avoid the use of an analog mixer and (2) remove the distortion and noise caused by multiple simultaneous state changes present in conventional pipeline ADCs. The inherent problems and limitations of conventional sampled data systems, signal processing, and neural networks cannot be solved within the currently available architectures. New approaches and architectures are needed to overcome the drawbacks of existing systems.

SUMMARY

In view of the foregoing, the embodiments herein provide a signal processing subsystem for processing an input signal having a measurement quantity, the signal processing subsystem comprising a plurality of N stages, where $N \geq 2$, each of the plurality of N stages being referred to herein as stage n for convenience of reference, where $1 \leq n \leq N$ except as otherwise noted, stage n for $n=1$ being a first stage of the plurality of N stages, stage n for $n=N$ being a last stage of the plurality of N stages, stage $n+1$ refers to one of the plurality of N stages that is an immediately succeeding stage of stage n, stage $n-1$ refers to one of the plurality of N stages that is an immediately preceding stage of stage n, each stage n, for $1 \leq n \leq N-1$, being configured to receive the input signal, each stage n being configured to receive a corresponding plurality of reference levels for the measurement quantity, each stage n, for $1 \leq n \leq N-1$, being configured to output an error value for the measurement quantity to stage $n+1$, each stage n, for $2 \leq n \leq N$, being configured to receive the error value for the measurement quantity from stage $n-1$, each stage n, for $1 \leq n \leq N$, being configured to output an output code; and a summing circuit configured to sum together the output code from every stage n to provide a digital output code that codes for at least an approximation of the measurement quantity of the input signal.

The measurement quantity may be voltage, wherein the corresponding plurality of reference levels for the measurement quantity is a corresponding plurality of reference voltage levels, and wherein the error value for the measurement quantity is an error voltage. The corresponding plurality of reference voltage levels received by each stage n for $2 \leq n \leq N$ may be effectively scaled so as to provide a plurality of corresponding scaled reference voltage levels for each stage n for $2 \leq n \leq N$, wherein none of the plurality of corresponding scaled reference voltage levels monitored by each stage n overlaps with any of the plurality of corresponding scaled reference voltage levels monitored by any other one of the plurality of N stages or with any of the corresponding plurality of reference voltage levels received by stage 1.

The first stage may comprise M+1 comparators and the corresponding plurality of reference voltage levels received by the first stage comprises M+1 reference voltage levels, where $3 \leq M$, each of the corresponding plurality of reference voltage levels received by the first stage being referred to herein as Level (m) for convenience of reference, where $0 \leq m \leq M$ except as otherwise noted, wherein Level (m)=$m\Delta$, where $\Delta$ is a predetermined voltage increment, wherein Level (m) for $1 \leq m \leq M-1$ form the corresponding plurality of reference voltage levels received by each stage n for $2 \leq n \leq N$ such that there are M−1 reference voltage levels in the corresponding plurality of reference voltage levels received by each stage n for $2 \leq n \leq N$. In an example, $5 \leq M$.

The corresponding plurality of reference voltage levels received by each stage n for $2 \leq n \leq N$ may be effectively scaled by a factor of $1/M^{n-1}$ so as to provide a plurality of corresponding scaled reference voltage levels for each stage n for $2 \leq n \leq N$ such that the plurality of corresponding scaled reference voltage levels for each stage n for $2 \leq n \leq N$ are finer and fit between a closest neighboring pair of the plurality of corresponding scaled reference voltage levels for stage n−1. Each stage n for $2 \leq n \leq N$ may comprise M−1 comparators. Each of the corresponding plurality of reference voltage levels received by the first stage may be supplied to a first input of a corresponding comparator of the first stage, the input signal is supplied to a second input of each comparator of the first stage, each comparator of the first stage has an output, wherein the first stage further comprises a first stage code converter circuit that receives the outputs of the comparators of the first stage and converts them to the output code outputted by the first stage, the output code outputted by the first stage coding for the number m of a highest one of the corresponding plurality of reference voltage levels received by the first stage that does not exceed the voltage of the input signal.

The signal processing subsystem may further comprise a voltage selector circuit for the first stage that receives the output code outputted by the first stage and outputs a first stage voltage selector circuit output signal that is a voltage given by $m\Delta$, where m is the number of the highest one of the corresponding plurality of reference voltage levels received by the first stage that does not exceed the voltage of the input signal. The signal processing subsystem may further comprise a summing circuit for the first stage that receives the first stage voltage selector circuit output signal and the input signal, sums the negative of the first stage voltage selector circuit output signal and the input signal and outputs the result as the error voltage of the first stage.

The signal processing subsystem may further comprise an amplifier circuit for each stage n, for $2 \leq n \leq N-1$, that receives the error voltage from stage n−1 and scales up the error voltage from stage n−1 by a factor of $M^{n-1}$ to generate a scaled-up error voltage from stage n−1 and outputs the scaled-up error voltage from stage n−1, wherein each of the corresponding plurality of reference voltage levels received by stage n, for $2 \leq n \leq N-1$, is supplied to a first input of a corresponding comparator of stage n, for $2 \leq n \leq N-1$, the scaled-up error voltage from stage n−1 is supplied to a second input of each comparator of stage n, for $2 \leq n \leq N-1$, each comparator of stage n, for $2 \leq n \leq N-1$, has an output, wherein stage n, for $2 \leq n \leq N-1$, further comprises a code converter circuit that receives the outputs of the comparators of stage n, for $2 \leq n \leq N-1$, and converts them to the output code outputted by stage n, for $2 \leq n \leq N-1$, the output code outputted by stage n, for $2 \leq n \leq N-1$, coding for a factor of $1/M^{n-1}$ multiplied by the number m of a highest one of the corresponding plurality of reference voltage levels received by stage n, for $2 \leq n \leq N-1$, that does not exceed the scaled-up error voltage from stage n−1.

The signal processing subsystem may further comprise an amplifier circuit for the last stage that receives the error voltage from stage N−1 and scales up the error voltage from stage N−1 by a factor of $M^{N-1}$ to generate a scaled-up error voltage from stage N−1 and outputs the scaled-up error voltage from stage N−1, wherein each of the corresponding plurality of reference voltage levels received by the last stage is supplied to a first input of a corresponding comparator of the last stage, the scaled-up error voltage from stage N−1 is supplied to a second input of each comparator of the last stage, each comparator of the last stage has an output, wherein the last stage further comprises a code converter circuit that receives the outputs of the comparators of the last stage and converts them to the output code outputted by the last stage, the output code outputted by the last stage coding for one of (a) a factor of $1/M^{N-1}$ multiplied by the number m of a highest one of the corresponding plurality of reference voltage levels received by the last stage that does not exceed the scaled-up error voltage from stage N−1 and (b) a factor of $1/M^{N-1}$ multiplied by the number m of a nearest one of the corresponding plurality of reference voltage levels received by the last stage that is nearest to the scaled-up error voltage from stage N−1, wherein in (b) one of rounding up and rounding down is used if the scaled-up error voltage from stage N−1 is equidistant from two of the corresponding plurality of reference voltage levels received by the last stage. The signal processing subsystem may further comprise a voltage selector circuit for each stage n, for $2 \leq n \leq N-1$, that receives the output code outputted by stage n, for $2 \leq n \leq N-1$, and outputs a voltage selector circuit output signal of stage n, for $2 \leq n \leq N-1$, that is a voltage given by $m\Delta/M^{n-1}$, where m is the number of the highest one of the corresponding plurality of reference voltage levels received by stage n, for $2 \leq n \leq N-1$, that does not exceed the scaled-up error voltage from stage n−1.

The signal processing subsystem may further comprise a summing circuit for each stage n, for $2 \leq n \leq N-1$, that receives the voltage selector circuit output signal of every stage of the plurality of N stages beginning with the first stage and up through stage n, for $2 \leq n \leq N-1$, and the input signal, and that sums the negative of the voltage selector circuit output signal of every stage of the plurality of N stages beginning with the first stage and up through stage n, for $2 \leq n \leq N-1$, and the input signal and outputs the result as the error voltage of stage n, for $2 \leq n \leq N-1$.

In an example, N=2, wherein the last stage is the second stage, wherein the first stage comprises M+1 comparators and the corresponding plurality of reference voltage levels received by the first stage comprises M+1 reference voltage levels, where $3 \leq M$, each of the corresponding plurality of reference voltage levels received by the first stage being referred to herein as Level (m) for convenience of reference, where $0 \leq m \leq M$ except as otherwise noted, wherein Level (m)=$m\Delta$, where $\Delta$ is a predetermined voltage increment, wherein Level (m) for $1 \leq m \leq M-1$ forms the corresponding plurality of reference voltage levels received by the second stage such that there are M−1 reference voltage levels in the corresponding plurality of reference voltage levels received by the second stage; wherein the second stage comprises M-1 comparators; wherein each of the corresponding plurality of reference voltage levels received by the first stage is supplied to a first input of a corresponding comparator of the first stage, the input signal is supplied to a second input of each comparator of the first stage, each comparator of the first stage has an output, wherein the first stage further comprises a first stage code converter circuit that receives the outputs of the comparators of the first stage and converts them to the output code outputted by the first stage, the output code outputted by the first stage coding for the number m of a highest one of the corresponding plurality of reference voltage levels received by the first stage that does not exceed the voltage of the input signal; wherein the signal processing subsystem further comprises a voltage selector circuit for the first stage that receives the output code outputted by the first stage and outputs a first stage voltage selector circuit output signal that is a voltage given by mΔ, where m is the number of the highest one of the corresponding plurality of reference voltage levels received by the first stage that does not exceed the voltage of the input signal; wherein the signal processing subsystem further comprises a summing circuit for the first stage that receives the first stage voltage selector circuit output signal and the input signal, sums the negative of the first stage voltage selector circuit output signal and the input signal and outputs the result as the error voltage of the first stage; and wherein the signal processing subsystem further comprises an amplifier circuit for the second stage that receives the error voltage from the first stage and scales up the error voltage from the first stage by a factor of M to generate a scaled-up error voltage from the first stage and outputs the scaled-up error voltage from the first stage, wherein each of the corresponding plurality of reference voltage levels received by the second stage is supplied to a first input of a corresponding comparator of the second stage, the scaled-up error voltage from the first stage is supplied to a second input of each comparator of the second stage, each comparator of the second stage has an output, wherein the second stage further comprises a code converter circuit that receives the outputs of the comparators of the second stage and converts them to the output code outputted by the second stage, the output code outputted by the second stage codes for one of (a) a factor of 1/M multiplied by the number m of a highest one of the corresponding plurality of reference voltage levels received by the second stage that does not exceed the scaled-up error voltage from the first stage and (b) a factor of 1/M multiplied by the number m of a nearest one of the corresponding plurality of reference voltage levels received by the second stage that is nearest to the scaled-up error voltage from the first stage, wherein in (b) one of rounding up and rounding down is used if the scaled-up error voltage from the first stage is equidistant from two of the corresponding plurality of reference voltage levels received by the second stage.

In an example, wherein the reference levels for the measurement quantity monitored by all the stages for $1 \le n \le N$, no more than a single reference level crossing can occur at one time. In an example, wherein of all the corresponding plurality of reference voltage levels received by the first stage and the plurality of corresponding scaled reference voltage levels for all stages for $2 \le n \le N$, no more than a single reference voltage level crossing can occur at one time. The plurality of reference levels for the measurement quantity received by stage 1 may be in the range of from $-\Delta(M-1)/2$ to $\Delta(M-1)/2$ for an integer $M \ge 3$.

Another embodiment provides a continuous time charge coupled device (CCD) subsystem comprising a level crossing analog-to-digital converter (ADC) configured to receive an input signal, the level crossing ADC having at least a first output and a second output, the level crossing ADC being configured to output a digitized representation of the input signal from its first output and to output a clock signal from its second output, the clock signal being based upon level crossings by the input signal; and a CCD array including n CCD cells, where $n \ge 2$, the CCD array includes a first CCD cell and a last CCD cell, each of the CCD cells includes at least a signal input, a signal output, and a clock input, the clock signal from the level crossing ADC is supplied to the clock input of each of the CCD cells, one of the input signal and the digitized representation of the input signal is supplied to the signal input of the first CCD cell, the signal output of the each of the CCD cells is supplied to the signal input of a CCD cell that is next in the CCD array, except for the last CCD cell, the signal outputs of all the CCD cells are lead out in parallel to form a CCD output array, wherein the clock signal from the level crossing ADC provides the 'clock' signal to transfer charge across the CCD array of CCD cells, and wherein the CCD cells are "clocked" by level crossing events expressed in the digitized representation of the input signal.

Another embodiment provides a software defined radio architecture comprising an antenna configured to receive radio frequency signals; a signal processing subsystem, wherein the signal processing subsystem is employed as a continuous time pipeline, level-crossing (LC) analog-to-digital converter (ADC), and wherein the signal processing subsystem comprises a plurality of N stages, where $N \ge 2$, each of the plurality of N stages being referred to herein as stage n for convenience of reference, where $1 \le n \le N$ except as otherwise noted, stage n for n=1 being a first stage of the plurality of N stages, stage n for n=N being a last stage of the plurality of N stages, stage n+1 refers to one of the plurality of N stages that is an immediately succeeding stage of stage n, stage n-1 refers to one of the plurality of N stages that is an immediately preceding stage of stage n, each stage n, for $1 \le n \le N-1$, being configured to receive the input signal, each stage n being configured to receive a corresponding plurality of reference levels for the measurement quantity, each stage n, for $1 \le n \le N-1$, being configured to output an error value for the measurement quantity to stage n+1, each stage n, for $2 \le n \le N$, being configured to receive the error value for the measurement quantity from stage n-1, each stage n, for $1 \le n \le N$, being configured to output an output code; and a summing circuit configured to sum together the output code from every stage n to provide a digital output code that codes for at least an approximation of the measurement quantity of the input signal. The software defined radio architecture further comprising a preamplifier having an input and an output, the preamplifier receiving a signal from the antenna and outputting an amplified signal from the preamplifier output and directly supplying, from the preamplifier output, the amplified signal to the signal processing subsystem as the input signal of the signal processing subsystem such that no analog mixer is used between the preamplifier and the signal processing subsystem; and a complex continuous time multiplier configured to convert the digital output code from the signal processing subsystem to baseband complex signals for further processing.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
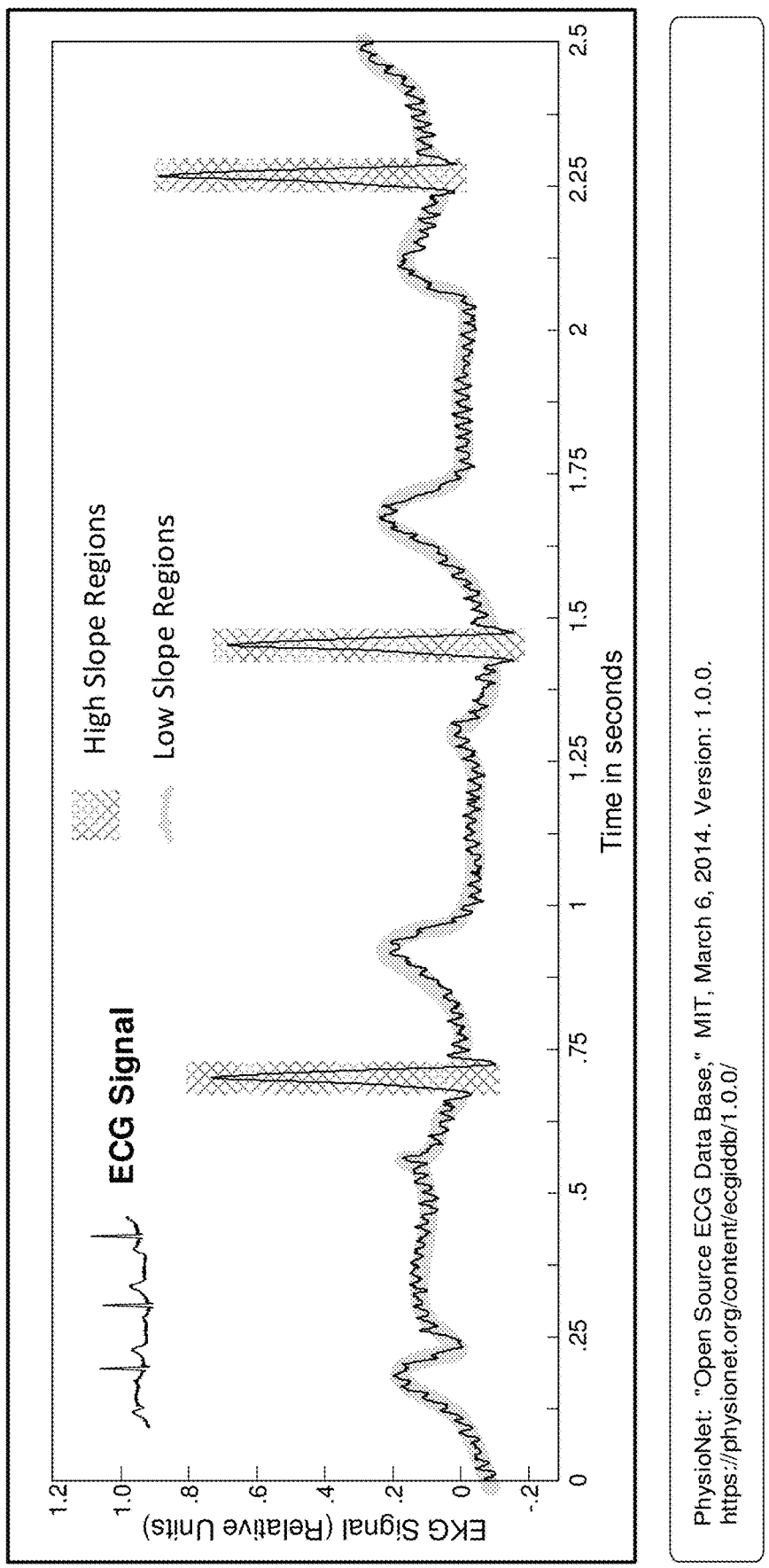
FIG. 1 shows an exemplary ECG signal illustrating regions of low slope and high slope.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide improved continuous time analog and digital signal processing systems and techniques to overcome the limitations present in discrete time (or space) signal processing systems while avoiding the drawbacks of current continuous time, flash, level crossing analog-to-digital converters. The embodiments herein provide continuous time analog and digital signal processing systems and methods that avoid the drawbacks of existing pipeline signal processing systems such as the complex amplitude error corrections, the complex timing error corrections, the significant calibration requirements, and the distortion and noise caused by multiple simultaneous state changes. In FIGS. 1 through 17B similar reference characters denote corresponding features consistently throughout the figures. Moreover, in the drawings, the size and relative sizes of components, layers, and regions, etc. may be exaggerated for clarity.

Figure 2:
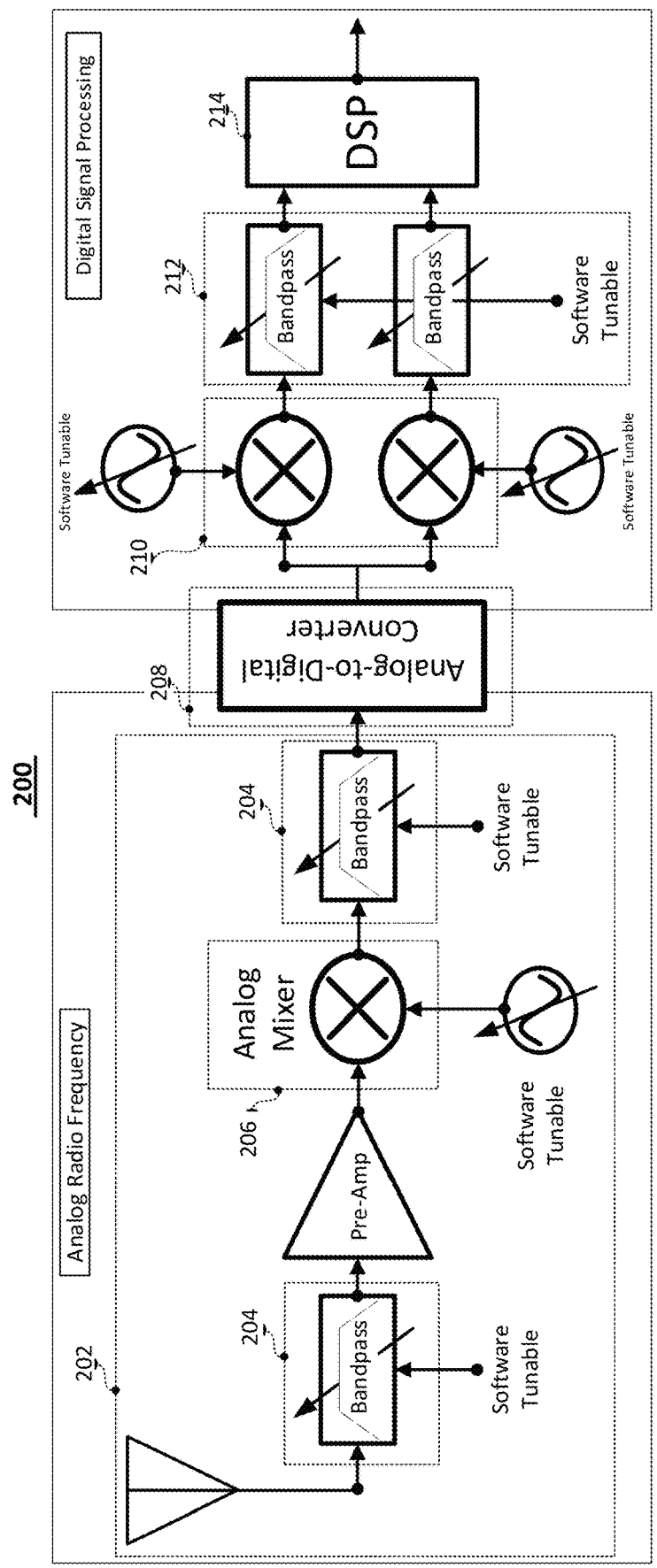
FIG. 2 shows a prior art signal processing system and subsystems.

Continuous time signal processing systems offer a number of architecture and performance advantages over conventional digital signal processing. For continuous time systems, the number of sample points is proportional to the slope of the input signal. FIG. 1 illustrates low slope and high slope regions for ECG signals. Continuous time signal processing can be applied to signal processing systems and subsystems, covering analog-to-digital converters, analog signal processing systems (CCDs, analog memories, etc.), software defined radios, and neural networks. FIG. 2 shows an example prior art signal processing system (software defined radio) and subsystems (filtering, frequency translation, etc.).

Common operations in signal processing systems cover filtering, frequency translation, analog-to-digital conversion, digital-to-analog conversion, and detection. Neural networks, and deep neural networks are large arrays of simple signal processing nodes typically based on simple math operations like addition, multiplication, and nonlinear activation functions.

The embodiments disclosed herein apply continuous time signal processing techniques to provide significant improvements over prior art signal processing architectures for software defined radios, neural network architectures, analog-to-digital conversion, and frequency translation.

Conventional neural networks are based on discrete time (or space). Spiking neural networks reduce computations; however, spiking neural networks are not taking full advantage of the signal processing properties and energy savings offered by continuous time systems.

One example of the embodiments disclosed herein is a continuous time, analog signal processing system. This system offers the benefits of low power analog signal processing for neural networks, deep neural networks, and analog signal processing and filtering. The continuous time, analog signal processing system adapts to the slope of the input signal, reduces the sampling rate, i.e. the number of sample points per unit time, when the input signal changes more gradually and increases the sampling rate when the input signal changes more rapidly, and saves energy.

Some embodiments disclosed herein relate to a continuous time pipeline level crossing analog-to-digital converter (ADC) architecture that overcomes several limitations present in conventional pipeline ADCs. Prior art pipeline flash ADCs require complex amplitude error corrections, complex timing error corrections, and significant calibration requirements to achieve high resolution.

Some embodiments disclosed herein relate to continuous time software defined radio architectures that employ continuous time pipeline level crossing ADCs in accordance with the embodiments disclosed herein. Prior art software defined radios (SDRs) are limited by: (1) poor intermodulation distortion; (2) a more complicated down conversion signal chain; and (3) poor performance under strong signals, jamming and impulse noise. Prior art SDR using conventional pipeline analog-to-digital converters suffer from amplitude and time delay errors from the structure of the analog-to-digital converter. Conventional pipelined ADC errors are significant when the input signal crosses a boundary between pipeline stages causing multiple simultaneous bit changes. A continuous time software defined radio architecture based on a continuous time pipeline level crossing ADC architecture according to the embodiments disclosed herein offers significantly improved linearity.

Figure 3:
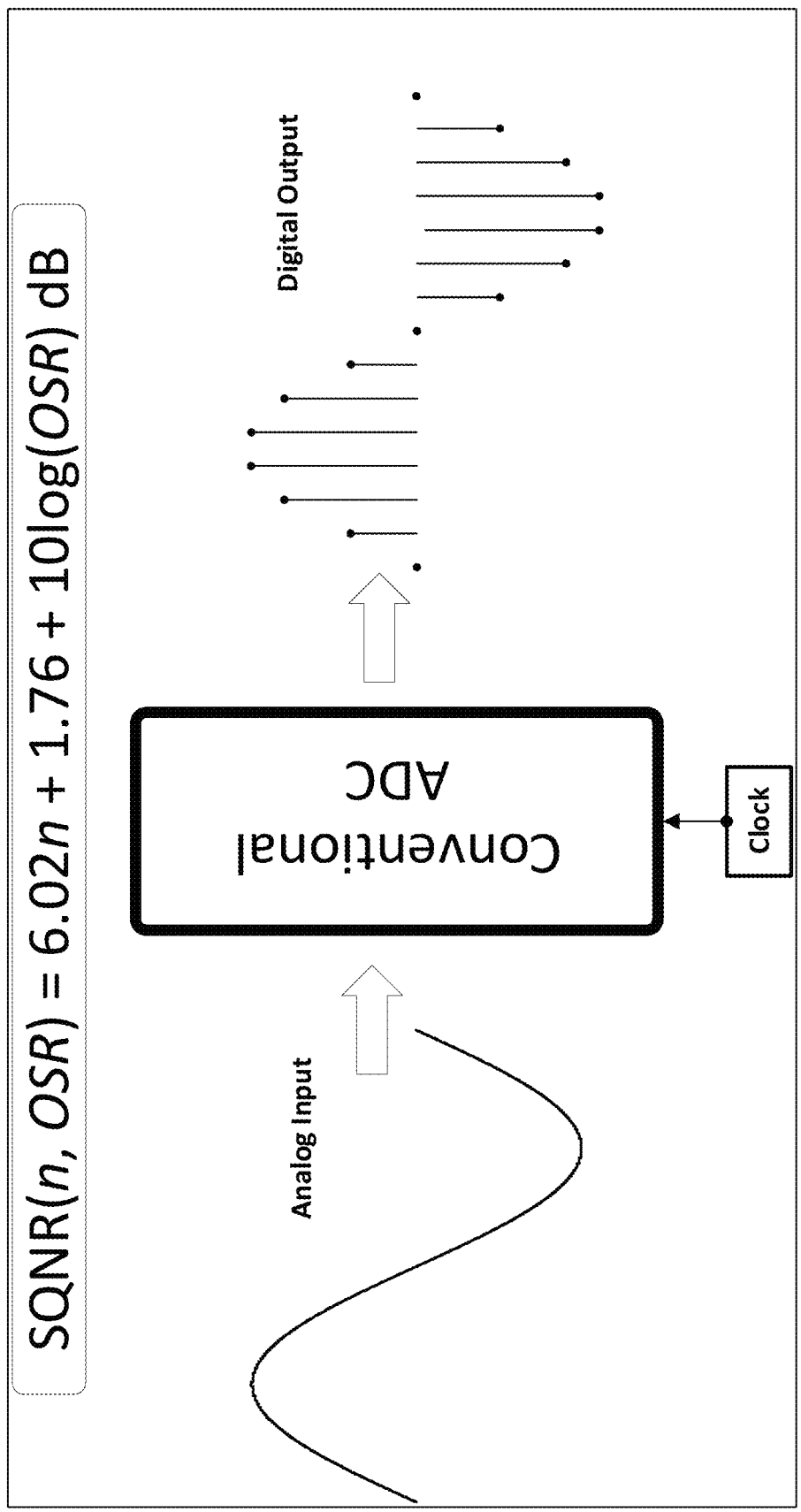
FIG. 3 shows a prior art analog-to-digital conversion system.
Figures 4A, 4B:
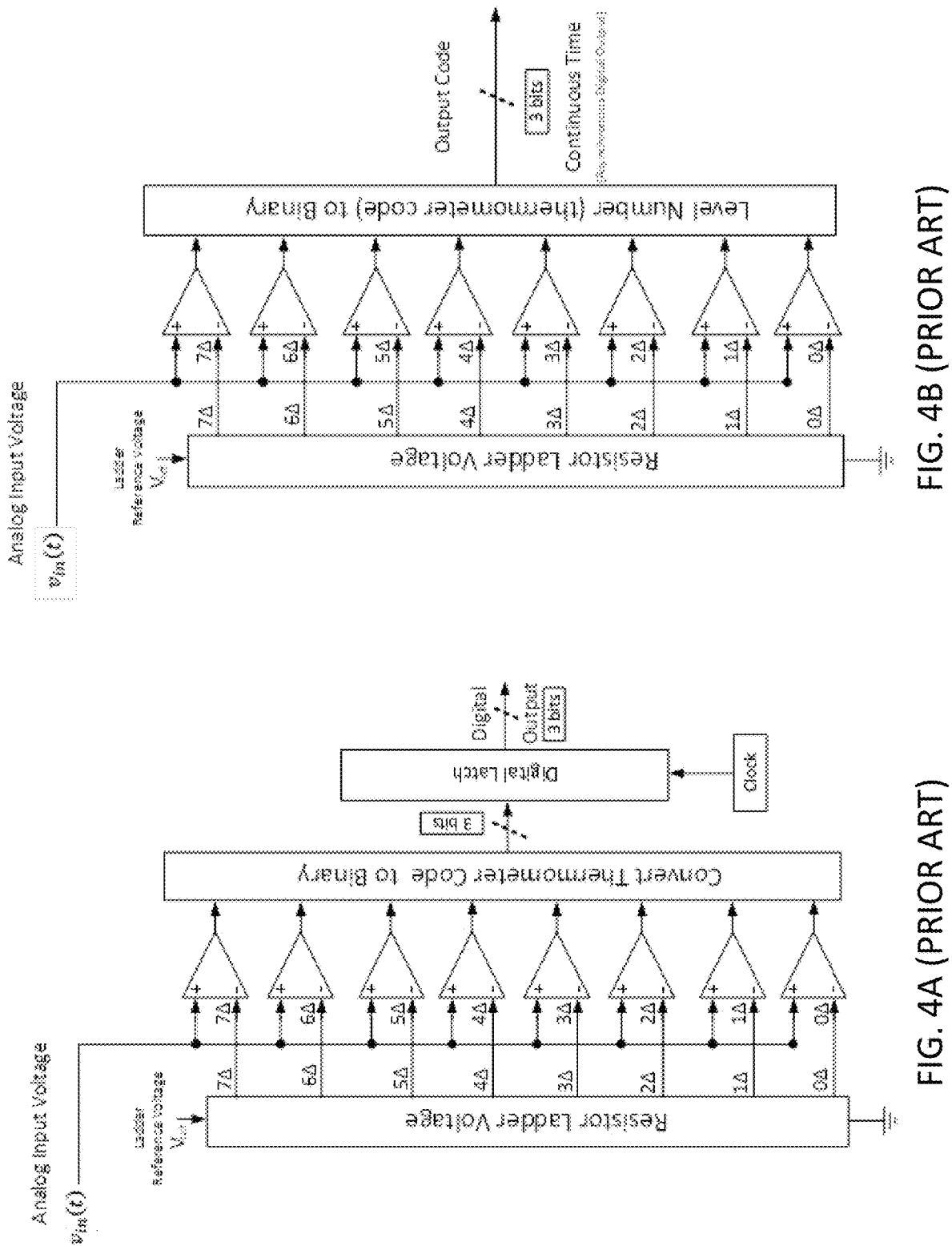
FIGS. 4A-4B. show prior art flash and flash level crossing ADCs.
Figure 5:
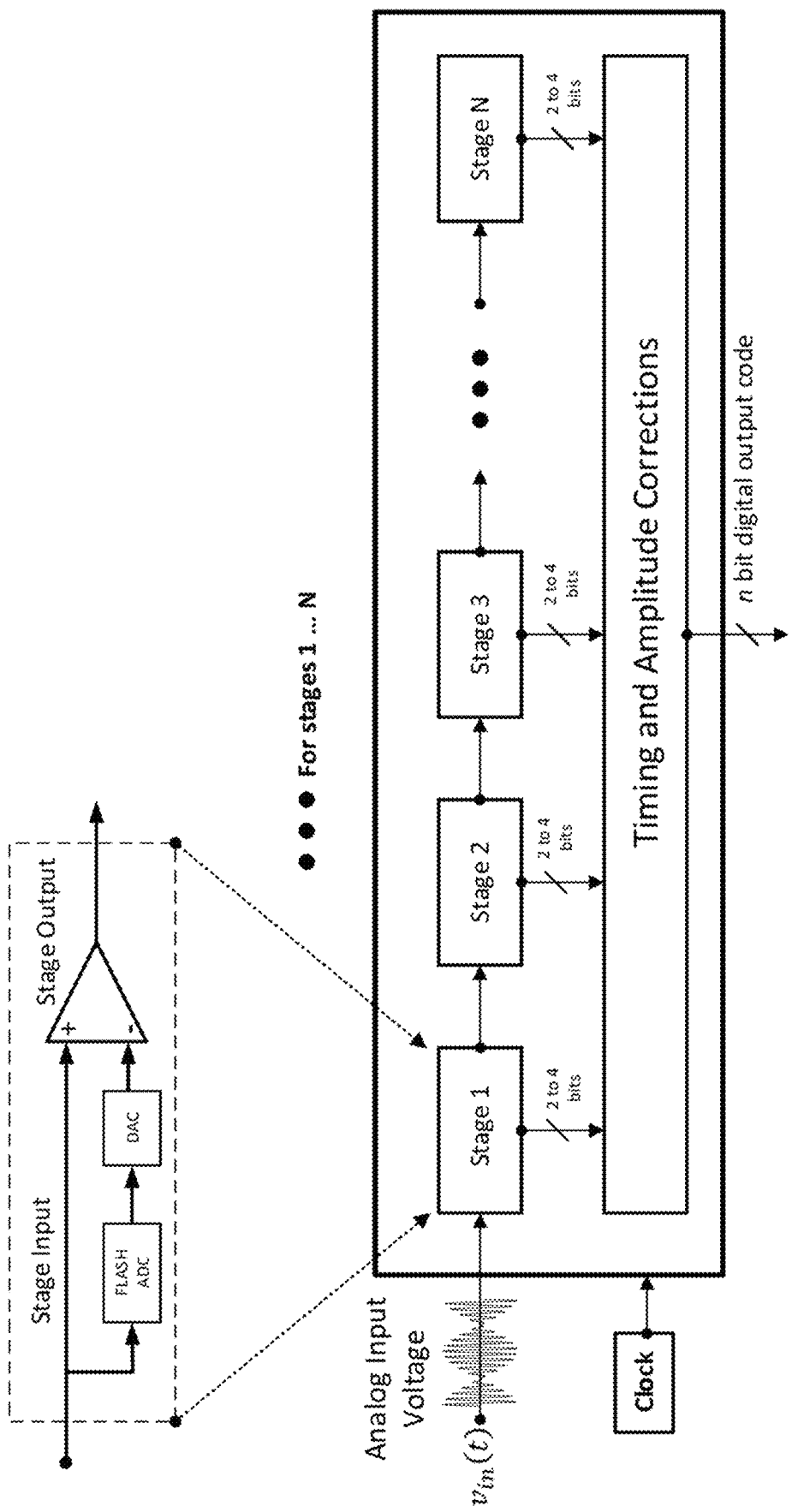
FIG. 5. shows a prior art pipeline flash ADC.

FIG. 3 illustrates a prior art, conventional analog-to-digital converter (ADC). Conventional ADCs are driven by a clock signal. FIGS. 4A and 4B compare a prior art flash ADC to a prior art, continuous time flash ADC. The flash ADC uses a clocked latch for sampling. The prior art continuous time flash ADC is fully asynchronous and does not use a clock. The prior art continuous time flash ADC does not have to wait for the next clock cycle to change state. When a pulse occurs, there is only a propagation delay through the comparators and digital logic. FIG. 5 shows a prior art, pipeline flash analog-to-digital converter. Each pipeline stage provides finer granularity measurements. Multiple bit changes in multiple pipeline stages can occur simultaneously. This complex pipeline behavior requires significant amplitude error, timing error, and calibration corrections. The pipeline flash analog-to-digital converter of FIG. 5 does not employ level crossing and uses a clock signal.

Figure 6A:
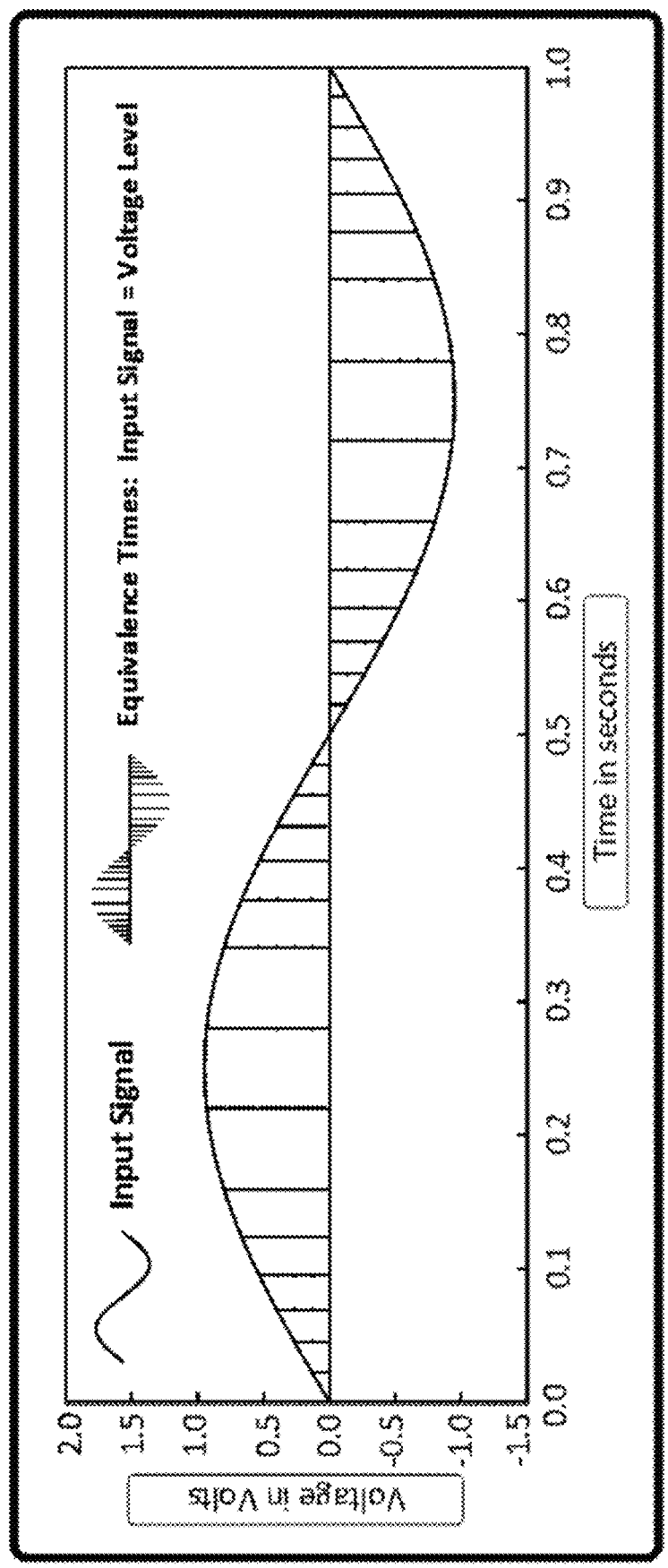
FIGS. 6A-6B show graphs illustrating prior art pulse and asynchronous zero order hold level crossing ADC outputs.
Figure 6B:
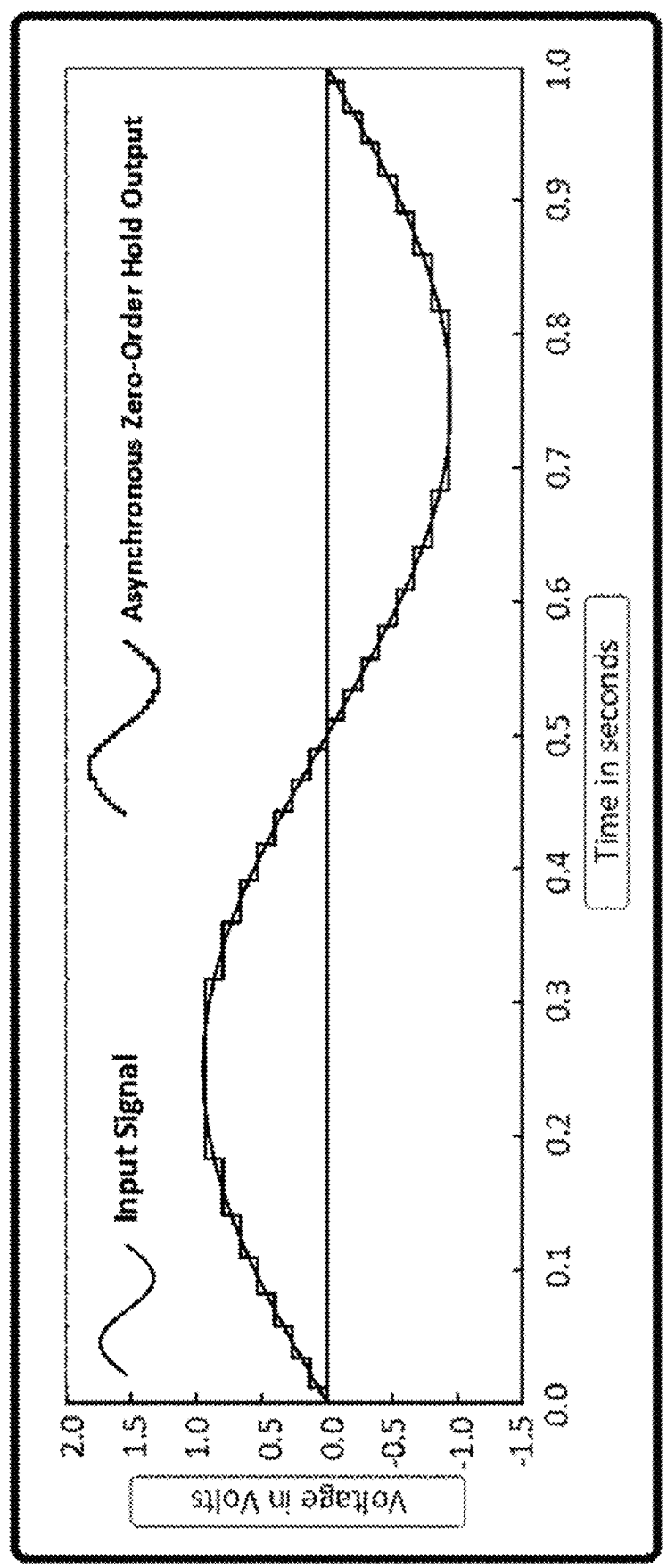

FIGS. 6A and 6B show prior art level crossing ADC operation graphs for the level crossing ADC of FIG. 4B. The equivalence times are the times when the input signal equals a discrete voltage level. The impulse amplitude at the equivalence time equals the crossed voltage level. Level crossing ADCs typically use an asynchronous zero-order hold to hold the output code constant until the next level crossing occurs. The level crossing ADCs such as that of FIG. 4B require exponential growth in the number of comparators used in order to increase the precision with which the digital output represents the analog input.

Figure 7:
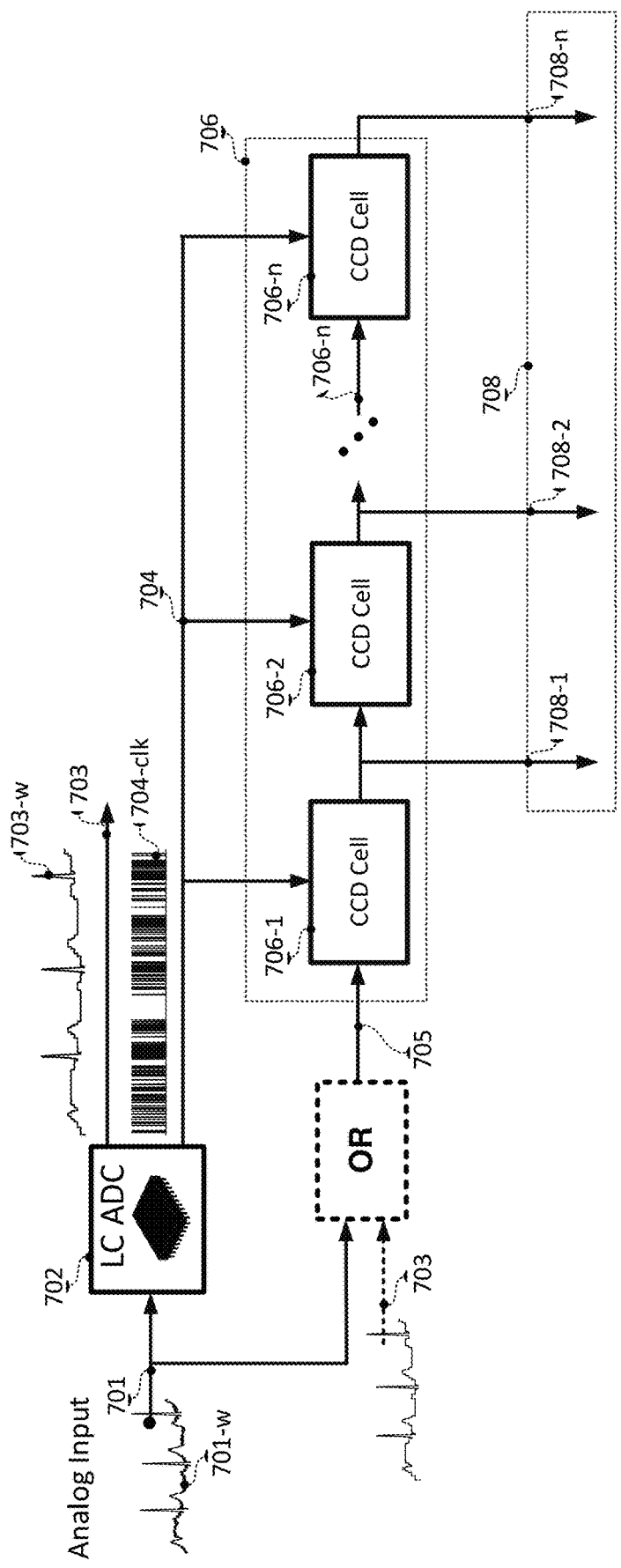
FIG. 7 is a diagrammatic view illustrating an example of a continuous time charge coupled device in accordance with an example embodiment disclosed herein.

Some embodiments herein are directed to continuous time, charge coupled devices for analog signal processing applications and neural network applications. An example of such continuous time, charge coupled devices is shown in FIG. 7. In this example, a level crossing analog-to-digital converter 702 provides the 'clock' signal to transfer charge across the array of CCD cells 706-1 through 706-n. The CCD cell outputs 708-1 through 708-n can then be processed by a traditional analog signal processing system, continuous time system, or digital signal processing.

Referring to FIG. 7, a continuous time charge coupled device (CCD) subsystem 700 in accordance with the embodiments disclosed herein can be seen. Analog input signal waveform 701-w is fed into input 701 to a level crossing ADC 702. Level crossing ADC has a first output signal line 703 and outputs a waveform 703-w via the output signal line 703. Level crossing ADC signal line 704 outputs level crossing time step 704-clk. CCD array 706 includes CCD cells 706-1 through 706-n. A level crossing analog-to-digital converter 702 provides the 'clock' signal 704 (waveform 704-w) to transfer charge across the CCD array 706 of CCD cells 706-1 and 706-2 through 706-n. Either the analog input signal 701, or LC ADC output 703 can be fed into CCD array 706. CCD cells are "clocked" by level crossing events 704-w. CCD array outputs 708 (708-1, 708-2, ..., 708-n) can be used to drive (1) an analog signal processing system, (2) a continuous time signal processing system or a (3) neural or deep neural network (analog, continuous time, or hybrid analog and continuous time).

FIG. 7, 700, is not a Shannon sampling system and does not have aliased noise like a conventional clocked CCD system. There is no time or spatial frequency aliasing, nor any time or spatial aliased noise. The continuous time analog signal processing concept illustrated in FIG. 7 can also be applied to flash memory cells, memristors, delay lines, or any other analog memory.

Referring again to FIG. 7, an example of a continuous time charge coupled device (CCD) subsystem in accordance with the embodiments herein can be seen. The continuous time charge coupled device (CCD) subsystem 700, includes a level crossing analog-to-digital converter (ADC) and a CCD array, can be seen.

The level crossing analog-to-digital converter (ADC) 702 is configured to receive an input signal 701-w. The level crossing ADC 702 has at least a first output 703 and a second output 704. The level crossing ADC 702 is configured to output a digitized representation 703-w of the input signal 701-w from its first output 703 and to output a clock signal 704-clk from its second output 704. The clock signal 704-clk is based upon level crossings by the input signal 701-w.

The CCD array 706 includes n CCD cells 706-1 through 706-n, where n≥2. The CCD array includes a first CCD cell 706-1 and a last CCD cell 706-n. Each of the CCD cells includes at least a signal input, a signal output, and a clock input. The clock signal 704-clk from the level crossing ADC 702 is supplied to the clock input of each of the CCD cells. One of the input signal 701-w and the digitized representation of the input signal 703-w is supplied to the signal input 705 of the first CCD cell 706-1, the signal output of the each of the CCD cells is supplied to the signal input of a CCD cell that is next in the CCD array 706, except for the last CCD cell 706-n, which has no next CCD cell. The signal outputs (708-1, 708-2, ..., 708-n) of all the CCD cells all lead out in parallel to form a CCD output array 708. The clock signal 704-clk from the level crossing ADC 702 provides the 'clock' signal to transfer charge across the CCD array 706 of CCD cells, and the CCD cells are "clocked" by level crossing events expressed in the digitized representation 703-w of the input signal 701-w.

Figure 8:
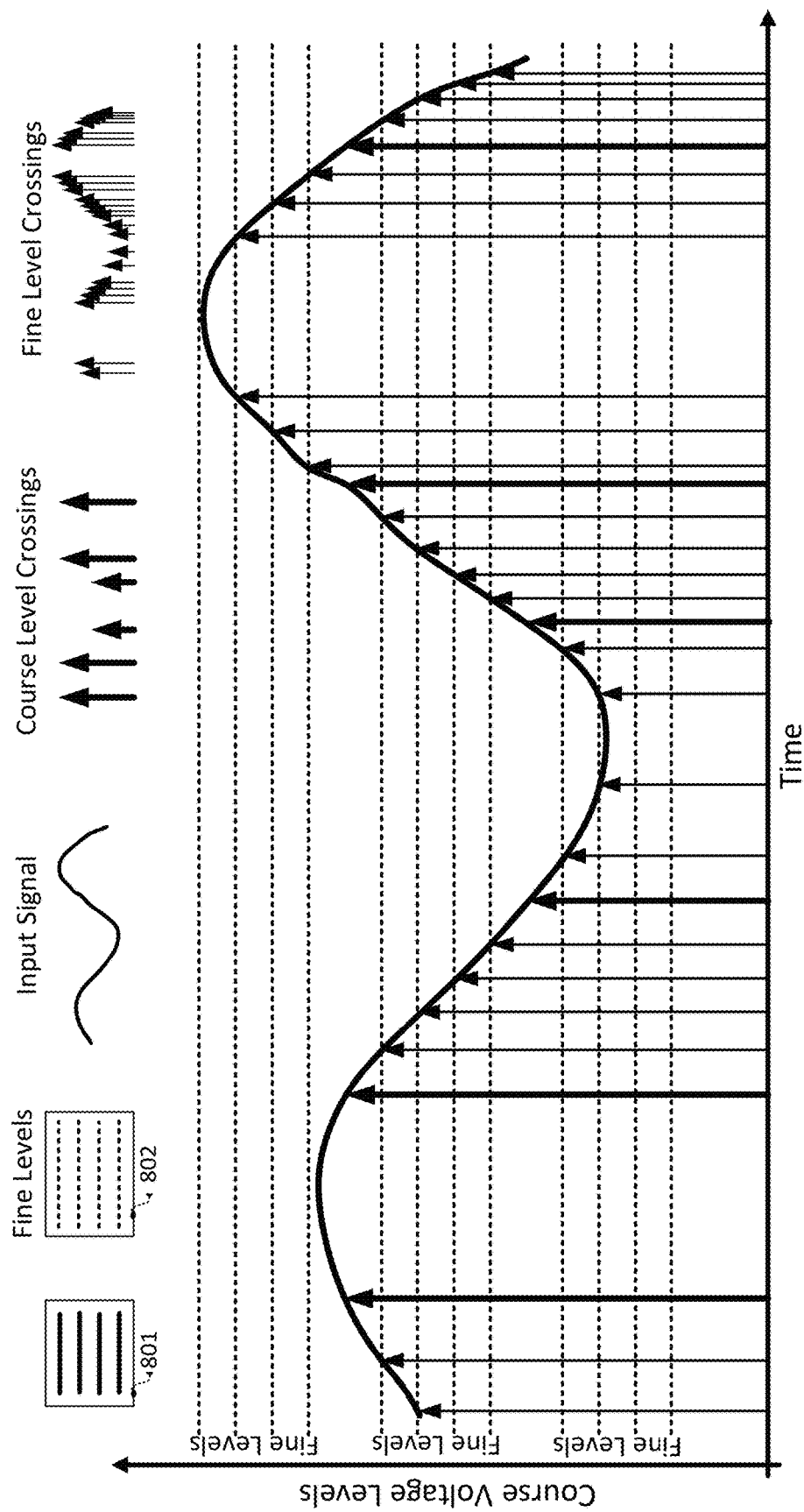
FIG. 8 is a graph illustrating the two stage pipeline level crossing ADC course and fine voltage outputs in accordance with an example embodiment disclosed herein.
Figure 9:
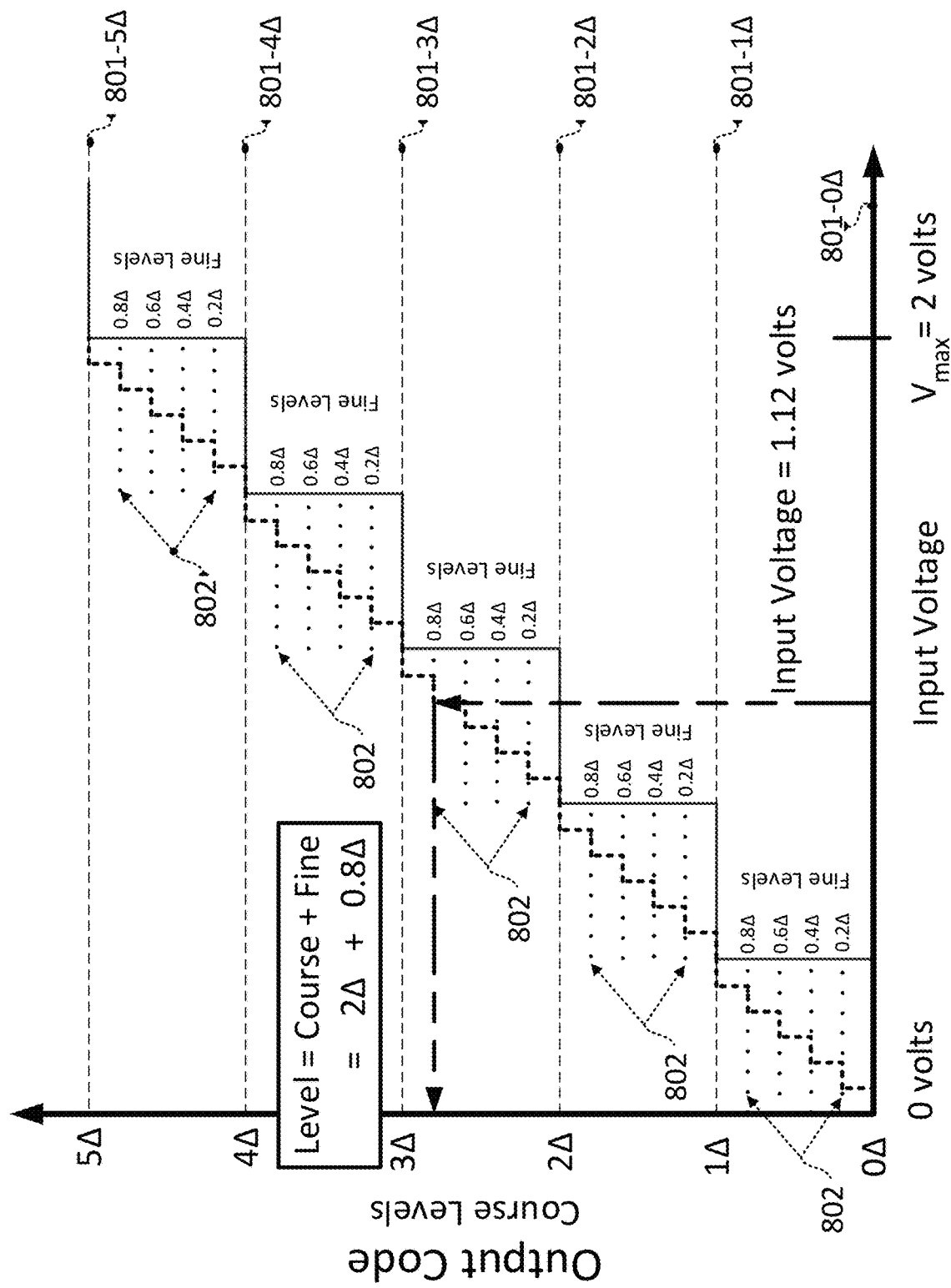
FIG. 9 is a graph illustrating the analog input to digital output code transfer function of a two stage pipeline level crossing ADC in accordance with an example embodiment disclosed herein.
Figure 10:
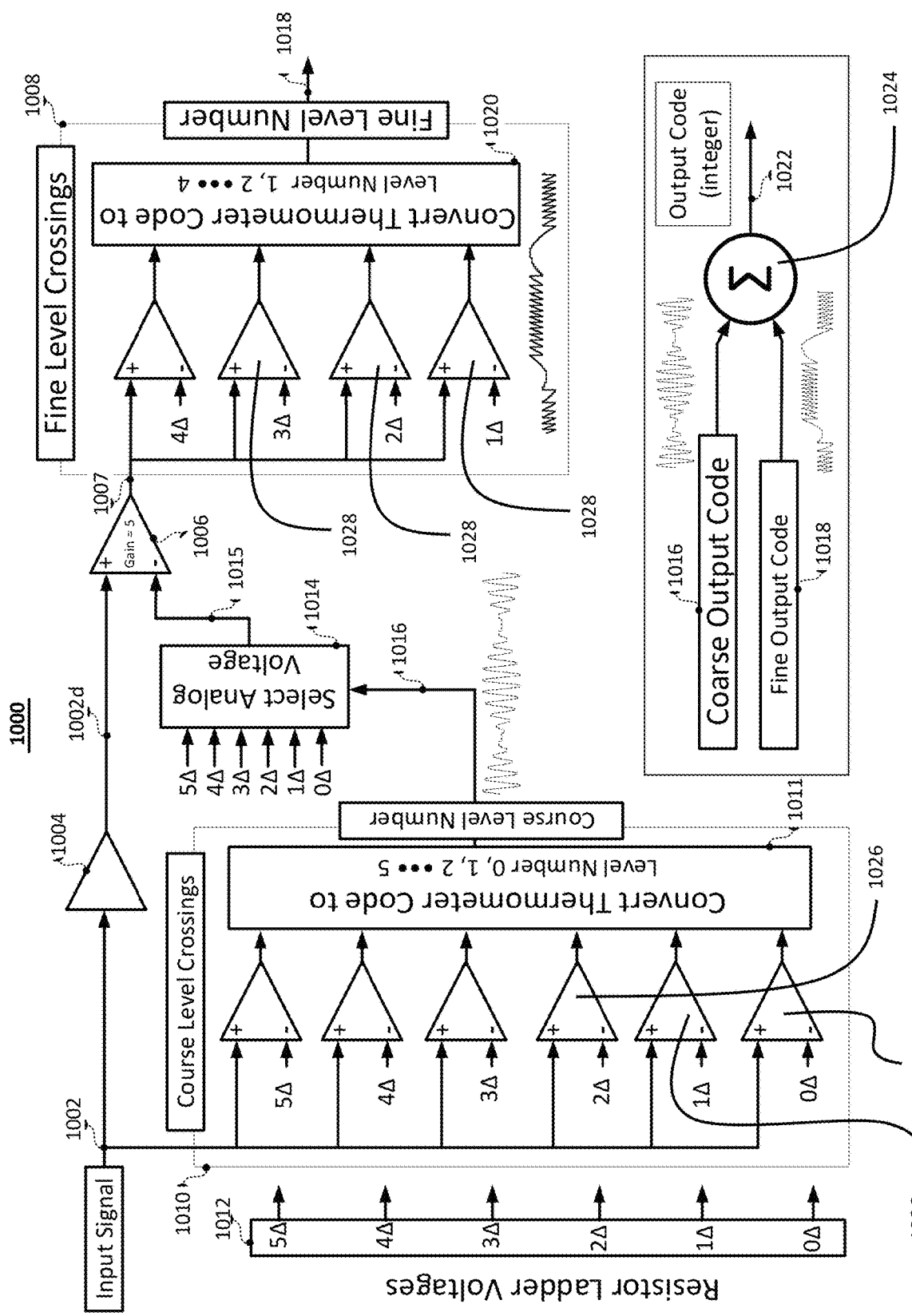
FIG. 10 is a schematic diagram illustrating a two stage pipeline level crossing ADC in accordance with an example embodiment disclosed herein.

FIG. 8, FIG. 9, and FIG. 10 illustrate the operation of an example 1000 of the pipeline level crossing ADC device in accordance with the embodiments disclosed herein. FIG. 8 and FIG. 9 show the 'coarse' 801 and 'fine' 802 voltage levels for an exemplar two-stage pipeline level crossing ADC device 1000. The 'fine' 802 voltage levels are distributed inside the 'course' 801 voltage levels. The 'coarse' 801-5Δ, 801-4Δ, 801-3Δ, 801-2Δ, 801-1Δ, and 801-0Δ voltage levels and 'fine' voltage levels 802 are spaced a fixed voltage difference apart within their corresponding voltage scales. In the illustrated example, the fixed voltage difference between the 'fine' voltage levels 802 is one fifth of the fixed voltage difference between the 'coarse' voltage levels 801 (i.e. the voltage levels 801-0Δ through 801-5Δ). A 'coarse' voltage level 801 cannot equal a 'fine' voltage level 802. The configuration of the voltage levels (801 and 802) of the ADC device 1000 guarantees only one voltage level in a single pipeline stage can be crossed at a time. This configuration greatly simplifies timing error correction, and amplitude error correction in a pipeline ADC.

FIG. 8 illustrates the operation of the continuous time pipeline level crossing analog-to-digital converter 1000, which is also referred to herein as the continuous time pipeline LC ADC 1000. The first pipeline stage provides the coarse level output (6 levels—801). The second pipeline stage has its fine 4 levels (802) inside the coarse voltage levels 801. This way there is no overlap between the coarse levels 801 and fine levels 802. This ensures that only one level can be crossed at a time for all pipeline stages. The amplitude scaling for the coarse and fine voltage levels provides for the fine voltages levels to be distributed between the coarse voltage levels. By only allowing for a single level to be crossed at a time, the continuous time pipeline LC ADC 1000 overcomes timing and amplitude accuracy errors present in conventional pipeline flash analog-to-digital converters.

FIG. 9 illustrates an input voltage to output level (digital code) transfer function for the continuous time pipeline LC ADC 1000. Coarse levels 801 are located at 0Δ, 1Δ, 2Δ, 3Δ, 4Δ, and 5Δ. The fine level crossing voltage levels 802 are 0.2Δ, 0.4Δ, 0.6Δ, and 0.8Δ. The fine voltage levels of 0.0Δ and 1.0Δ are not used. The fine voltage levels 802 of 0.0Δ and 1.0Δ would overlap with the coarse voltage levels 801 of 0Δ through 5Δ, respectively. The pipeline design guarantees that only one level in any pipeline stage may be crossed at a time. In other words, no more than one level crossing of any kind, coarse or fine, can take place at one time. FIG. 9 shows an example input voltage of 1.12 volts that maps to Coarse Level=2Δ and Fine Level=0.8Δ for an output value=2.8Δ.

FIG. 10 presents a simplified block diagram for the 2-stage, continuous time pipeline, level crossing analog-to-digital converter 1000. The resistor ladder 1012 outputs an array of reference voltages for the comparator array of the level crossing detection circuit 1010 of the first stage, which detects level crossings of the coarse voltage levels, of the continuous time pipeline LC ADC 1000. Each of the array of reference voltages outputted by the resistor ladder 1012 is greater than the immediately preceding member of the array of reference voltages by a voltage increment Δ. The input signal 1002 is simultaneously compared to all voltage levels in the reference voltage array outputted by the resistor ladder 1012. The outputs of the comparators 1026 of the coarse level crossing detection circuit 1010, which form what is sometimes referred to as a thermometer code, are converted by the code converter circuit 1011 to a suitable output code 1016 (binary, Gray code, etc.). The output code 1016 is indicative of the level number corresponding to the highest coarse reference voltage level that does not exceed the analog input signal 1002.

The selector circuit 1014 uses the output code 1016 to select the corresponding reference voltage from the reference voltage array outputted by the resistor ladder 1012. The corresponding reference voltage is the highest whole number multiple of the resistor ladder voltage difference 4 that does not exceed the analog input signal 1002. The corresponding reference voltage, which is also the highest coarse (or first stage) voltage level that does not exceed the analog input signal 1002, is outputted by the selector circuit 1014 as the selector circuit output signal 1015. The highest coarse (or first stage) voltage level that does not exceed the analog input signal 1002 is also referred to herein as the corresponding coarse or first stage voltage or voltage level corresponding to the analog input signal 1002.

The input signal 1002 is received as the input to the compensating circuit 1004. The compensating circuit 1004 outputs an output signal 1002d. The input signal 1002 is routed through the compensating circuit 1004 so as to compensate for propagation delays from the level crossing detection circuit 1010 and voltage selector circuit 1014. The scaling circuit, also referred to herein as a gain stage, 1006 scales the error voltage, given by the difference between the output signal 1002d of the compensating circuit 1004 and the corresponding coarse or first stage voltage (signal 1002d minus signal 1015) in order to allow the reference voltage array outputted by the resistor ladder 1012, excluding the first and last reference voltages, to provide the reference voltage levels for the 'fine' or second stage. In the illustrated example, the voltages 1Δ, 2Δ, 3Δ, and 4Δ are supplied as reference voltages to the comparator array of the level crossing detection circuit 1008 of the second stage.

The gain of the scaling circuit 1006 is selected so that voltage levels in 802, which fit between nearest pairs of the 'coarse' voltage levels 801 (any pair of 'coarse' voltage levels that are Δ volts apart), can be provided by scaling the corresponding 'coarse' voltage levels 1Δ, 2Δ, 3Δ, and 4Δ. Accordingly, in this example, the scaling circuit 1006 scales up the difference between the output signal 1002d of the compensating circuit 1004 and the corresponding coarse voltage (i.e. the error voltage) to produce the scaling circuit output 1007, which is also referred to herein as the scaled error voltage. The scaling circuit 1006 scales up the error voltage so that the ratio of the scaling circuit output 1007 (i.e. the scaled error voltage) to the error voltage is the same as the ratio of the voltage range of the resistor ladder output to Δ. In the illustrated example of FIG. 10, this ratio would be 5:1. More generally, the ratio would be M:1, where 0 through MΔ is the voltage range of the array of reference voltages outputted by the resistor ladder 1012. Accordingly, there are M+1 reference voltages in the array of reference voltages outputted by the resistor ladder 1012, with 0Δ included, and there are M+1 comparators 1026 in the first stage of the continuous time pipeline LC ADC 1000. The choice of the scaling ratio, M:1 in this example, ensures that the proportion of the scaled error voltage relative to the reference voltage range (e.g. MΔ) will be the same as the proportion of the error voltage to the reference voltage increment (e.g. Δ) separating each reference voltage from its immediate predecessor.

Although a voltage range of 0-ΔM is used for the array of reference voltages in this example, a reference voltage array of −Δ(M−1)/2 through Δ(M−1)/2, where M is preferably odd, may be used in other examples with a scaling factor that is commensurate with the chosen range for the reference voltage array. For example, the plurality of reference levels for the measurement quantity received by stage 1 may be in the range of from −Δ(M−1)/2 to Δ(M−1)/2 for an integer M≥3.

The 'fine' voltage levels 802 of 0.0Δ and 1.0Δ (lowest and highest fine voltage levels) corresponding to Resistor Ladder Voltage array 1012's voltage levels of 5Δ and 0Δ (course voltages 801) are not used. These fine voltage levels 802 would overlap with the coarse voltage levels 801. The fine level crossing detection circuit 1008 simultaneously compares the scaled error voltage 1007 to Resistor Ladder Voltage 1012 voltage steps 1Δ through 4Δ. The code converter circuit 1020 of the second stage converts the thermometer code from the comparators in the second stage level crossing detection circuit 1008 (i.e. the array of output signals from the comparators of the second stage) to suitable output code 1018 (binary, Gray code, etc.). The output code 1018 of the code converter circuit 1020 of the second stage may digitally code for the highest level number of the array of reference voltages outputted by the resistor ladder 1012 that does not exceed the scaled error voltage and which is then scaled by a factor of $M^{-1}$ to fit between the coarse voltage levels. In other words, the output code 1018 of the code converter circuit 1020 of the second stage may digitally code for the highest 'fine' reference voltage level that does not exceed the error voltage. Alternatively, the code converter circuit 1020 may be configured to output an output code 1018 that corresponds to the error voltage being rounded up or down depending on whether the error voltage is above or below the closest 'fine' reference voltage level. The summing circuit 1024 sums the coarse stage output 1016 and the fine stage output 1018 to provide the 'digital' output code 1022 that codes for a practically useful approximation of the voltage of the input signal 1002. Multiplying the 'digital' output code 1022 by the voltage value of $\Delta$ provides a practically useful approximation of the voltage of the analog input signal 1002.

Figure 11:
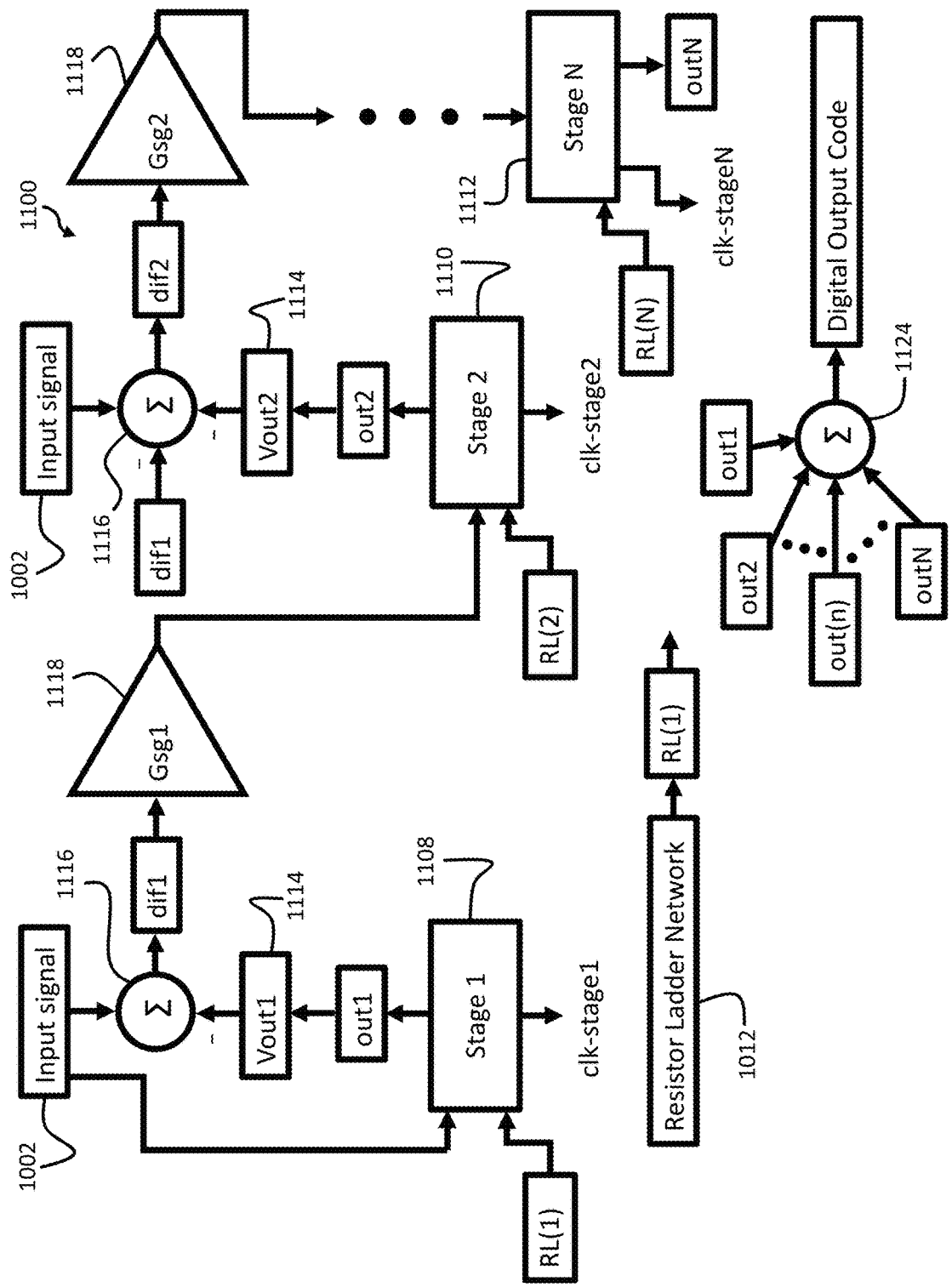
FIG. 11 is a schematic diagram illustrating a n-stage pipeline level crossing ADC in accordance with an example embodiment disclosed herein.

The continuous time LC ADC 1000 is scalable to N stages, where N is any number equal to or greater than 2, to provide a digital representation of the voltage of the input signal 1002 to any desired level of accuracy. FIG. 11 shows and example of a continuous time, N-pipeline stage, level crossing analog-to-digital converter 1100. The first stage 1108 of the N-stage, continuous time LC ADC 1100 may include M+1 comparators, where M may for example be 5, as was the case with the continuous time LC ADC 1000. Each subsequent stage 1110 of the N-stage, continuous time LC ADC 1100 may include M−1 comparators as the first reference voltage level (e.g. $0\Delta$) and the last reference voltage level (e.g. $M\Delta$ or $5\Delta$) are omitted from the reference voltage levels RL(1) outputted by the resistor ladder 1012 that are supplied to the second and subsequent stages as RL(2) through RL(N) in order to avoid overlap with the reference voltage levels of the immediately preceding stage.

The first stage of the N-stage, continuous time LC ADC 1100 may include a code converter circuit 1011 as was the case with the continuous time LC ADC 1000. The second stage of the N-stage, continuous time LC ADC 1100 may include a code converter circuit 1020 as was the case with the second stage of the continuous time LC ADC 1000. Each subsequent stage of the N-stage, continuous time LC ADC 1100 may include a code converter circuit similar to code converter circuit 1020 of the second stage of the continuous time LC ADC 1000. The code converter circuit of the nth stage from among the third and subsequent stages of the N-stage, continuous time LC ADC 1100 may scale down the number of the highest corresponding reference voltage level of the corresponding stage that does not exceed the scaled error voltage (this is the output of the amplifier having the gain Gsg(n−1) that is inputted to the corresponding stage) by a factor of $1/M^{(n-1)}$. Each stage of the N-stage, continuous time LC ADC 1100 outputs an output code out(n), where $1 \leq n \leq N$. The output code out(n) of the nth stage of the N-stage, continuous time LC ADC 1100 codes for the highest corresponding reference voltage level among the corresponding reference voltage levels of the nth stage that does not exceed the un-scaled error voltage dif(n−1) of the immediately preceding stage. The corresponding reference voltage levels of each stage, i.e. the nth stage, of the N-stage, continuous time LC ADC 1100 fit between a corresponding pair of the reference voltage levels of the immediately preceding stage. The corresponding pair of the reference voltage levels of the immediately preceding stage are separated by a voltage difference of $\Delta/M^{n-2}$, while the reference voltage levels of the nth stage are each separated from the immediately preceding reference voltage level of the nth stage by $\Delta/M^{n-1}$.

A voltage selector 1114, such as the selector circuit 1014 or a digital-to-analog converter (DAC) for example, is provided for each stage other than the last stage 1112 and receives the output code out(n) from the corresponding stage. For each stage, i.e. for the nth stage with n ranging from 1 to N−1, the voltage selector 1114 produces a voltage output Vout(n), which is given by the product of the output code out(n) and the voltage increment $\Delta$. A summing circuit 1116 is provided for each stage of the N-stage, continuous time LC ADC 1100, except for the last stage 1112. For the nth stage, the summing circuit 1116 sums the input signal 1002 and the negated sum $-\Sigma_{i=1}^{i=n}\text{Vout}(i)$ (i.e. −1 times the sum Vout(1)+ . . . +Vout(n) and outputs the result as the error voltage dif(n).

In cases where the reference voltage levels outputted by the resistor ladder 1012 are used to provide the reference voltage levels (RL(2) through RL(N)) in each stage, the resistor ladder reference voltage levels may have to be scaled down, at least for the third and subsequent stages, to fit between the corresponding pair of reference voltage levels of the immediately preceding stage or the error voltage dif(n) must be scaled up to ensure that the proportion between the scaled error voltage and the full voltage range of the reference voltage levels RL(1) outputted by the resistor ladder 1012 (i.e. $M\Delta$) is the same as the proportion between the error voltage dif(n) and the voltage range for the reference voltage levels of the corresponding stage (i.e. the nth stage or stage n) given by $M\Delta/M^{n-1}$.

An amplifier circuit 1118 is provided for each stage of the N-stage, continuous time LC ADC 1100, except for the first stage. The scaled error voltage supplied to each nth stage, where n ranges from 2 to N, is the output of the amplifier having the gain Gsg(n−1). In the illustrated examples, the gain Gsg(n−1) is given by $M^{n-1}$. The scaled error voltage, based on the dif(n−1) and the gain Gsg(n−1), is supplied to the nth stage of the N-stage, continuous time LC ADC 1100 and is used by the nth stage to generate the output code out(n) in the same manner as described with respect to the second stage of the continuous time LC ADC 1000. The summing circuit 1124 sums all the output codes out(n), i.e. out1+out2+out3 . . . +outN, to provide the 'digital' output code that codes for the voltage of the input signal 1002 to any desired level of accuracy. Multiplying the 'digital' output code by the voltage value of the voltage increment $\Delta$ provides an approximation of the voltage of the analog input signal 1002 with the desired level of accuracy.

The embodiments of the analog-to-digital converters disclosed herein, including the exemplary embodiments 1000 and 1100, have several advantageous features. In the embodiments disclosed herein, there is no overlap between the coarse levels and fine levels. This ensures that only one level can be crossed at a time for all pipeline stages. By only allowing for a single level to be crossed at a time, the embodiments disclosed herein overcome timing and amplitude accuracy errors present in prior art pipeline flash analog-to-digital converters. Some examples of the embodiments herein only require a single resistor ladder network for all pipeline stages resulting in simplification of the design. The embodiments disclosed herein greatly simplify timing error correction and greatly simplify asynchronous finite state machine controller and gray code implementation.

In the embodiments disclosed herein, the digitized representation of the input signal voltage is accurate to within $\Delta/M^{N-1}$. This level of accuracy is achieved with 4N+2 comparators. To achieve the same level of accuracy with the prior art level crossing ADC, such as shown in FIG. 4B, would require $7(4^{N-1})$ comparators.

An un-clocked (continuous time) pipeline level crossing ADC, exemplified by the continuous time pipeline LC ADCs 1000 and 1100, has several properties that provide for a better analog-to-digital converter. Only one level crossing may occur at a time for all stages in the continuous time pipeline LC ADCs 1000 and 1100. The amplitude level can only change by 1 level at a time, Level(n+1)=Level(n)±1. As illustrated in FIG. 10, for a two-stage pipeline, level crossing ADC, the course 801 and fine levels 802 never overlap. FIG. 9 shows the input voltage to digital output code transfer function for FIG. 8. For a transition from a fine level to a course level, only one level crossing occurs. A block diagram for a two-stage pipelined, level crossing ADC is shown in FIG. 10. The resistor ladder provides 6 voltage levels. The course level 801 (stage 1, 1010) level crossing ADC uses all 6 voltage levels. The fine 802 (stage 2, 1008) ADC only uses 4 of the 6 levels 801 (the top level and bottom level are not used). By not using the top and bottom levels of 801, the design guarantees that only one level crossing can occur at a time for all pipeline stages in the continuous time pipeline LC ADCs 1000 and 1100. In prior art conventional pipeline ADCs, 2-4 bits in each pipeline stage can change at the same time. Multiple bits in the output digital code can change on every clock cycle. A large number of simultaneously changing bits, severely complicates amplitude and timing error corrections for prior art conventional pipeline ADCs.

The properties of the un-clocked (continuous time) pipeline level crossing ADCs disclosed herein overcome time delay and amplitude limitations present in current pipeline ADCs. The amplitude and timing corrections are much simpler for the un-clocked (continuous time) pipeline level crossing ADCs disclosed herein. Since only one level in a single pipeline stage can change at a time, no timing corrections may actually be required. Amplitude compensation for the stage gain amplifier circuits is required; however, gain calibration is simple compared to timing error compensation.

The continuous time, pipeline level crossing ADCs disclosed herein may have a clock and digital latches added to bring the performance benefits described previously to a conventional, clocked pipeline flash analog-to-digital converter.

Referring again to FIGS. 10 and 11, the continuous time pipeline LC ADCs 1000 and 1100 are examples of a signal processing subsystem for processing an input signal having a measurement quantity, which is voltage in the illustrated examples. It should be understood that the measurement quantity of the input signal may be other than voltage, such as, for example, current, charge, flux, etc. The signal processing subsystem (1000, 1100) includes a plurality of N stages (1108, 1110, 1112), where N≥2, and a summing circuit (1024, 1124).

Each of the plurality of N stages may be referred to herein as stage n for convenience of reference, where 1≤n≤N except as otherwise noted. Stage n for n=1 is a first stage of the plurality of N stages, and stage n for n=N is a last stage of the plurality of N stages. Stage n+1 refers to one of the plurality of N stages that is an immediately succeeding stage of stage n, and stage n−1 refers to one of the plurality of N stages that is an immediately preceding stage of stage n. Each stage n, for 1≤n≤N−1, is configured to receive the input signal 1002. The input signal lines may incorporate delay circuitry, such as for example compensating circuit 1004, so as to compensate for propagation delays wherever appropriate. Each stage n is configured to receive a corresponding plurality of reference voltage levels RL. Each stage n, for 1≤n≤N−1, is configured to output an error voltage to stage n+1. Each stage n, for 2≤n≤N, is configured to receive an error voltage from stage n−1. Each stage n is configured to output an output code. The summing circuit 1024, 1124 is configured to sum together the output code from every stage n to provide a digital output code that codes for an approximation of the voltage of the input signal 1002.

In the signal processing subsystem according to the embodiments disclosed herein, none of the corresponding plurality of reference voltage levels received by each stage n overlaps with any of the corresponding plurality of reference voltage levels received by any other one of the plurality of N stages. Even when the corresponding plurality of reference voltage levels received by each stage n is obtained from the output of the same resistor ladder, the corresponding plurality of reference voltage levels received by each stage n for 2≤n≤N are effectively scaled by a factor of $1/M^{n-1}$ so as to provide a plurality of corresponding scaled reference voltage levels for each stage n for 2≤n≤N such that the plurality of corresponding scaled reference voltage levels for each stage n for 2≤n≤N are finer and fit between a closest neighboring pair of the plurality of corresponding scaled reference voltage levels for stage n−1. Accordingly, even when the corresponding plurality of reference voltage levels received by each stage n is obtained from the output of the same resistor ladder, any overlaps between the reference voltage levels of one stage and the reference voltage levels of another stage can be avoided. An overlap refers to a situation where a reference voltage level from one stage coincides with a reference voltage level from another stage.

In the example embodiment of FIG. 11, the signal processing subsystem 1100 has at least three stages such that N≥3. The first stage includes M+1 comparators 1026 and the corresponding plurality of reference voltage levels received by the first stage comprises M+1 reference voltage levels, where 3≤M. In the illustrated example, M=5. Each of the corresponding plurality of reference voltage levels received by the first stage may be referred to herein as Level (m) for convenience of reference, where 0≤m≤M except as otherwise noted. The voltage value of Level (m) is given by Level (m)=mΔ, where Δ is a predetermined voltage increment. Level (m) for 1≤m≤M−1 form the corresponding plurality of reference voltage levels received by each stage n for 2≤n≤N such that there are M−1 reference voltage levels in the corresponding plurality of reference voltage levels received by each stage n for 2≤n≤N. In some embodiments disclosed herein M may be 5 or greater such that 5≤M.

In some embodiments of the signal processing subsystem disclosed herein, each stage n, for 2≤n≤N, includes M−1 comparators 1028. Each of the corresponding plurality of reference voltage levels received by the first stage is supplied to a first input of a corresponding comparator of the first stage, and the input signal is supplied to a second input of each comparator of the first stage. Each comparator of the first stage has an output, and the first stage further comprises a first stage code converter circuit 1011 that receives the outputs of the comparators of the first stage and converts them to the output code (out1, 1016) outputted by the first stage. The output code outputted by the first stage codes for the number m of a highest one of the corresponding plurality of reference voltage levels received by the first stage that does not exceed the voltage of the input signal 1002.

In the signal processing subsystem according to some embodiments disclosed herein, the signal processing subsystem further includes a voltage selector circuit for the first stage. The voltage selector circuit 1014 for the first stage receives the output code outputted by the first stage and outputs a first stage voltage selector circuit output signal 1015 that is a voltage given by $m\Delta$, where m is the number of the highest one of the corresponding plurality of reference voltage levels received by the first stage that does not exceed the voltage of the input signal 1002.

In the signal processing subsystem according to some embodiments disclosed herein, the signal processing subsystem further includes a summing circuit for the first stage that receives the first stage voltage selector circuit output signal 1015 and the input signal 1002, sums the negative of the first stage voltage selector circuit output signal 1015 and the input signal 1002 and outputs the result as the error voltage dif1 of the first stage. "Input signal" and "input signal 1002" should be understood to refer generically to the input signal or the input signal that has been compensated for propagation delays elsewhere in the circuit unless otherwise specified.

In the signal processing subsystem according to some embodiments disclosed herein, the signal processing subsystem further includes an amplifier circuit 1118 for each stage n, for $2 \le n \le N-1$, that receives the error voltage from stage n−1 and scales up the error voltage from stage n−1 by a factor of $M^{n-1}$ to generate a scaled-up error voltage from stage n−1 and outputs the scaled-up error voltage from stage n−1. Each of the corresponding plurality of reference voltage levels received by stage n, for $2 \le n \le N-1$, is supplied to a first input of a corresponding comparator 1028 of stage n, for $2 \le n \le N-1$, and the scaled-up error voltage from stage n−1 is supplied to a second input of each comparator 1028 of stage n, for $2 \le n \le N-1$. Each comparator 1028 of stage n, for $2 \le n \le N-1$, has an output. Stage n, for $2 \le n \le N-1$, further includes a code converter circuit 1020 that receives the outputs of the comparators 1028 of stage n for $2 \le n \le N-1$ and converts them to the output code outputted by stage n, for $2 \le n \le N-1$. The output code outputted by stage n, for $2 \le n \le N-1$, codes for a factor of $1/M^{n-1}$ multiplied by the number m of a highest one of the corresponding plurality of reference voltage levels received by stage n, for $2 \le n \le N-1$, that does not exceed the scaled-up error voltage from stage n−1.

In the signal processing subsystem according to some embodiments disclosed herein, the signal processing subsystem further includes an amplifier circuit 1118 for the last stage that receives the error voltage from stage N−1 and scales up the error voltage from stage N−1 by a factor of $M^{N-1}$ to generate a scaled-up error voltage from stage N−1 and outputs the scaled-up error voltage from stage N−1. Each of the corresponding plurality of reference voltage levels received by the last stage is supplied to a first input of a corresponding comparator 1028 of the last stage, and the scaled-up error voltage from stage N−1 is supplied to a second input of each comparator 1028 of the last stage. Each comparator 1028 of the last stage has an output. The last stage further includes a code converter circuit 1020 that receives the outputs of the comparators 1028 of the last stage and converts them to the output code 1018 outputted by the last stage. The output code 1018 outputted by the last stage codes for one of (a) a factor of $1/M^{N-1}$ multiplied by the number m of a highest one of the corresponding plurality of reference voltage levels received by the last stage that does not exceed the scaled-up error voltage from stage N−1 and (b) a factor of $1/M^{N-1}$ multiplied by the number m of a nearest one of the corresponding plurality of reference voltage levels received by the last stage that is nearest to the scaled-up error voltage from stage N−1. In option (b) one of rounding up and rounding down is used if the scaled-up error voltage from stage N−1 is equidistant from two of the corresponding plurality of reference voltage levels received by the last stage.

In the signal processing subsystem according to some embodiments disclosed herein, the signal processing subsystem further includes a voltage selector circuit 1114 for each stage n, for $2 \le n \le N-1$, that receives the output code outputted by stage n, for $2 \le n \le N-1$, and outputs a voltage selector circuit output signal Vout(n) of stage n, for $2 \le n \le N-1$, that is a voltage given by $m\Delta/M^{n-1}$, where m is the number of the highest one of the corresponding plurality of reference voltage levels received by stage n, for $2 \le n \le N-1$, that does not exceed the scaled-up error voltage from stage n−1.

In the signal processing subsystem according to some embodiments disclosed herein, the signal processing subsystem further includes a summing circuit 1116 for each stage n, for $2 \le n \le N-1$, that receives the voltage selector circuit output signal of every stage of the plurality of N stages beginning with the first stage and up through stage n, for $2 \le n \le N-1$, and the input signal 1002, and that sums the negative of the voltage selector circuit output signal of every stage of the plurality of N stages beginning with the first stage and up through stage n, for $2 \le n \le N-1$, and the input signal 1002 and outputs the result as the error voltage dif(n) of stage n, for $2 \le n \le N-1$.

In the signal processing subsystem according to the embodiment of FIG. 10, N=2 as there are only two stages, and the last stage is the second stage. The first stage includes M+1 comparators 1026 and the corresponding plurality of reference voltage levels received by the first stage includes M+1 reference voltage levels. M may be greater than or equal to 3 ($3 \le M$). In the illustrated embodiment, M=3. Each of the corresponding plurality of reference voltage levels received by the first stage may be referred to herein as Level (m) for convenience of reference, where $0 \le m \le M$ except as otherwise noted. The voltage value of Level (m) is given by Level (m)=$m\Delta$, where $\Delta$ is a predetermined voltage increment. Level (m) for $1 \le m \le M-1$ form the corresponding plurality of reference voltage levels received by the second stage such that there are M−1 reference voltage levels in the corresponding plurality of reference voltage levels received by the second stage. The second stage includes M−1 comparators 1028.

Each of the corresponding plurality of reference voltage levels received by the first stage is supplied to a first input of a corresponding comparator 1026 of the first stage, and the input signal 1002 is supplied to a second input of each comparator 1026 of the first stage. Each comparator 1026 of the first stage has an output, and the first stage further includes a first stage code converter circuit 1011 that receives the outputs of the comparators 1026 of the first stage and converts them to the output code 1016 outputted by the first stage. The output code 1016 outputted by the first stage codes for the number m of a highest one of the corresponding plurality of reference voltage levels received by the first stage that does not exceed the voltage of the input signal.

The signal processing subsystem 1000 further includes a voltage selector circuit 1014 for the first stage that receives the output code outputted by the first stage and outputs a first stage voltage selector circuit output signal 1015 that is a voltage given by mΔ, where m is the number of the highest one of the corresponding plurality of reference voltage levels received by the first stage that does not exceed the voltage of the input signal 1002.

The signal processing subsystem 1000 further includes a summing circuit for the first stage that receives the first stage voltage selector circuit output signal 1015 and the input signal 1002, or the delay-compensated input signal 1002d, sums the negative of the first stage voltage selector circuit output signal 1015 and the input signal 1002 or 1002d and outputs the result as the error voltage of the first stage. In the illustrated embodiment, the amplifier 1006, which has one inverting input, serves the functions of both summing circuit and the amplifier circuit discussed below.

The signal processing subsystem 1000 further includes an amplifier circuit (provided by amplifier 1006) for the second stage that receives the error voltage from the first stage and scales up the error voltage from the first stage by a factor of M to generate a scaled-up error voltage from the first stage and outputs the scaled-up error voltage 1007 from the first stage. Each of the corresponding plurality of reference voltage levels received by the second stage is supplied to a first input of a corresponding comparator of the second stage, and the scaled-up error voltage 1007 from the first stage is supplied to a second input of each comparator 1028 of the second stage. Each comparator 1028 of the second stage has an output. The second stage further includes a code converter circuit 1020 that receives the outputs of the comparators 1028 of the second stage and converts them to the output code 1018 outputted by the second stage. The output code 1018 outputted by the second stage codes for one of (a) a factor of 1/M multiplied by the number m of a highest one of the corresponding plurality of reference voltage levels received by the second stage that does not exceed the scaled-up error voltage from the first stage and (b) a factor of 1/M multiplied by the number m of a nearest one of the corresponding plurality of reference voltage levels received by the second stage that is nearest to the scaled-up error voltage from the first stage. In option (b), one of rounding up and rounding down is used if the scaled-up error voltage 1007 from the first stage is equidistant from two of the corresponding plurality of reference voltage levels received by the second stage. In the illustrative examples of FIGS. 10 and 11, the reference voltages or voltage levels are supplied to the inverting inputs of the comparators, while the input signal or the scaled-up error voltages are supplied to the noninverting inputs of the comparators.

In some embodiments herein, of all the reference levels for the measurement quantity monitored by all the stages for 1≤n≤N, no more than a single reference level crossing can occur at one time. In one example, of all the corresponding plurality of reference voltage levels received by the first stage and the plurality of corresponding scaled reference voltage levels for all stages n where for 2≤n≤N, no more than a single reference voltage level crossing can occur at one time. This arrangement significantly simplifies timing error correction.

In some examples described above, the same reference voltages RL(2) through RL(N) are supplied to the corresponding stages 2 through N and have the values outputted by the resistor ladder 1012 excluding 0Δ and MΔ. In these examples, the error voltage is scaled up by a factor of $M^{(n-1)}$ for each stage n such that the gain Gsg(n) for stages 1 through N−1 is different for each stage. In some alternative embodiments herein, the gain Gsg(n) can be the same for all stages if the reference voltages RL(3) through RL(N) supplied to each stage n≥3 are scaled down by a factor of 1/M relative to the reference voltages supplied to the immediately preceding stage for stages 3 and higher.

Figure 12:
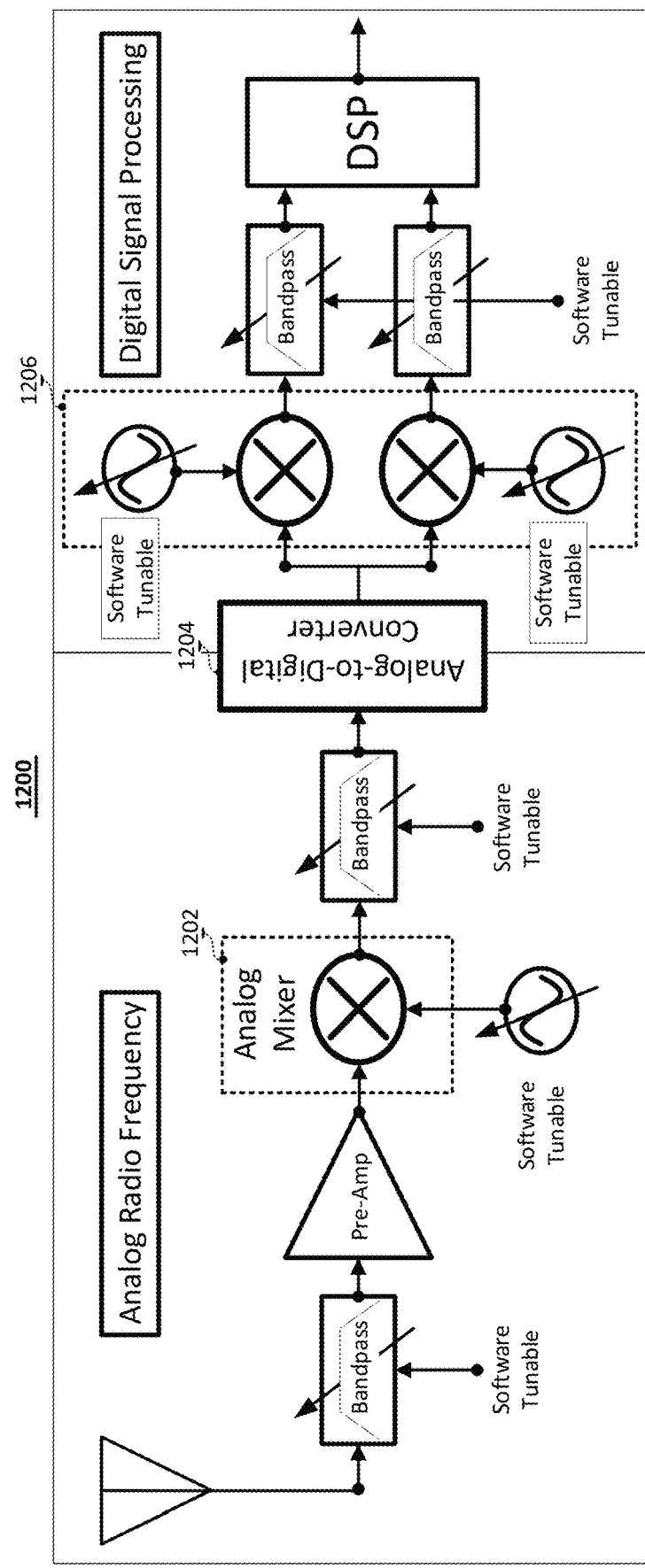
FIG. 12 is a schematic diagram illustrating a prior art software defined radio.

A prior art software defined radio (SDR) 1200 is shown in FIG. 12. Prior art SDRs are limited by the nonlinearities in the analog mixer stage 1202. The analog mixer suffers from insertion loss, nonlinearities, and intermodulation distortion (IMD). 1 MB in 1202 is very poor for high input signal levels, jamming, and impulse noise. Prior art analog-to-digital converter 1204 is typically a pipeline analog-to-digital converter with the performance limitations previously described in the earlier discussion of prior art software defined radios herein and in reference to the prior art level crossing ADC operation graphs of FIGS. 6A and 6B. The SDR architecture in 1200 requires a system clock and requires significant energy to clock data throughout the system. Clocked complex multiplier 1206 also requires significant energy to operate.

Figure 13:
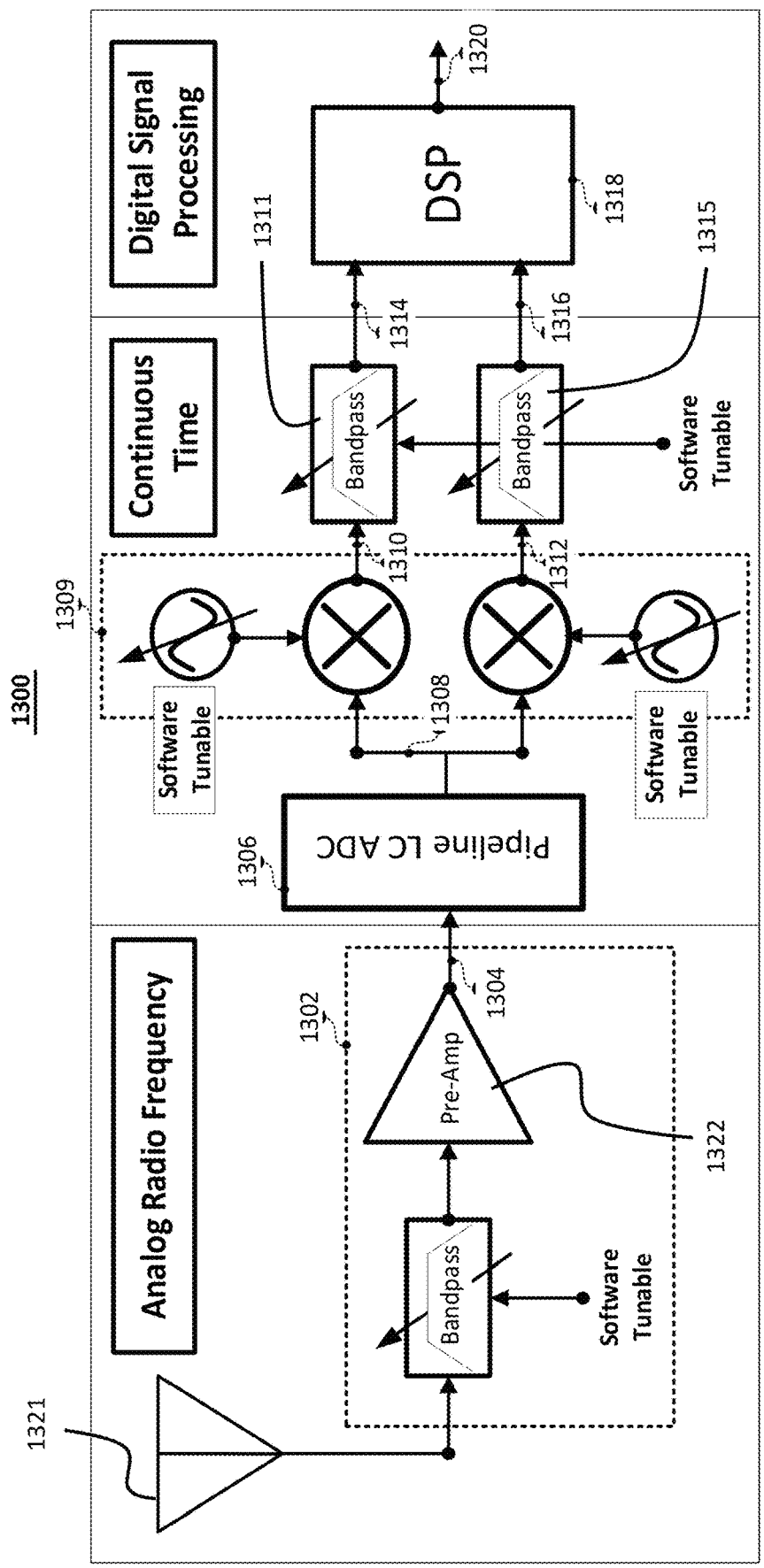
FIG. 13 is a schematic diagram illustrating a software defined radio with pipeline level crossing ADC in accordance with an example embodiment disclosed herein.

A continuous time software defined radio 1300 in accordance with the embodiments disclosed herein is illustrated in FIG. 13. The continuous time software defined radio 1300 may, for example, use the continuous time pipeline level crossing analog-to-digital converter 1000 or the continuous time pipeline level crossing analog-to-digital converter 1100. The analog front end of the SDR 1302 does not use an analog mixer. The SDR 1300 is not limited by nonlinearities and intermodulation distortion present in conventional SDRs 1200. Continuous time pipeline level crossing ADC 1306 converts the analog input 1304 to continuous time (asynchronous digital) signal 1308. Complex continuous time multiplier 1309 converts signal 1308 to baseband complex signals 1310 and 1312. The complex signals 1310 and 1312 are filtered using band-pass filters 1311 and 1315 to provide complex signals 1314 and 1316. Complex signals 1314 and 1316 can be interpolated and converted for traditional digital signal processing using DSP circuit 1318 to produce the output signal 1320, or further processed using continuous time signal processing.

Referring again to FIG. 13, an example of a software defined radio architecture 1300 in accordance with the embodiments herein can be seen. The software defined radio architecture includes an antenna 1321; a continuous time pipeline, level-crossing (LC) analog-to-digital converter (ADC) 1306; a preamplifier 1322; and a complex continuous time multiplier 1309. The antenna 1321 is configured to receive radio frequency signals. The continuous time pipeline, level-crossing (LC) analog-to-digital converter (ADC) 1306 may be a signal processing subsystem in accordance with the embodiments disclosed herein, for example the embodiments 1000 and 1100. The signal processing subsystem 1306 is employed as a continuous time pipeline, level-crossing (LC) analog-to-digital converter (ADC).

The preamplifier 1322 has an input and an output. The preamplifier 1322 receives a signal from the antenna 1321 and outputs an amplified signal 1304 from the preamplifier output and directly supplies, from the preamplifier output, the amplified signal 1304 to the signal processing subsystem 1306 as the input signal of the signal processing subsystem 1306 such that no analog mixer is used between the preamplifier 1322 and the signal processing subsystem 1306. The complex continuous time multiplier 1309 is configured to convert the digital output code 1308 from the signal processing subsystem 1306 to baseband complex signals 1310 and 1312 for further processing.

Figure 14A:
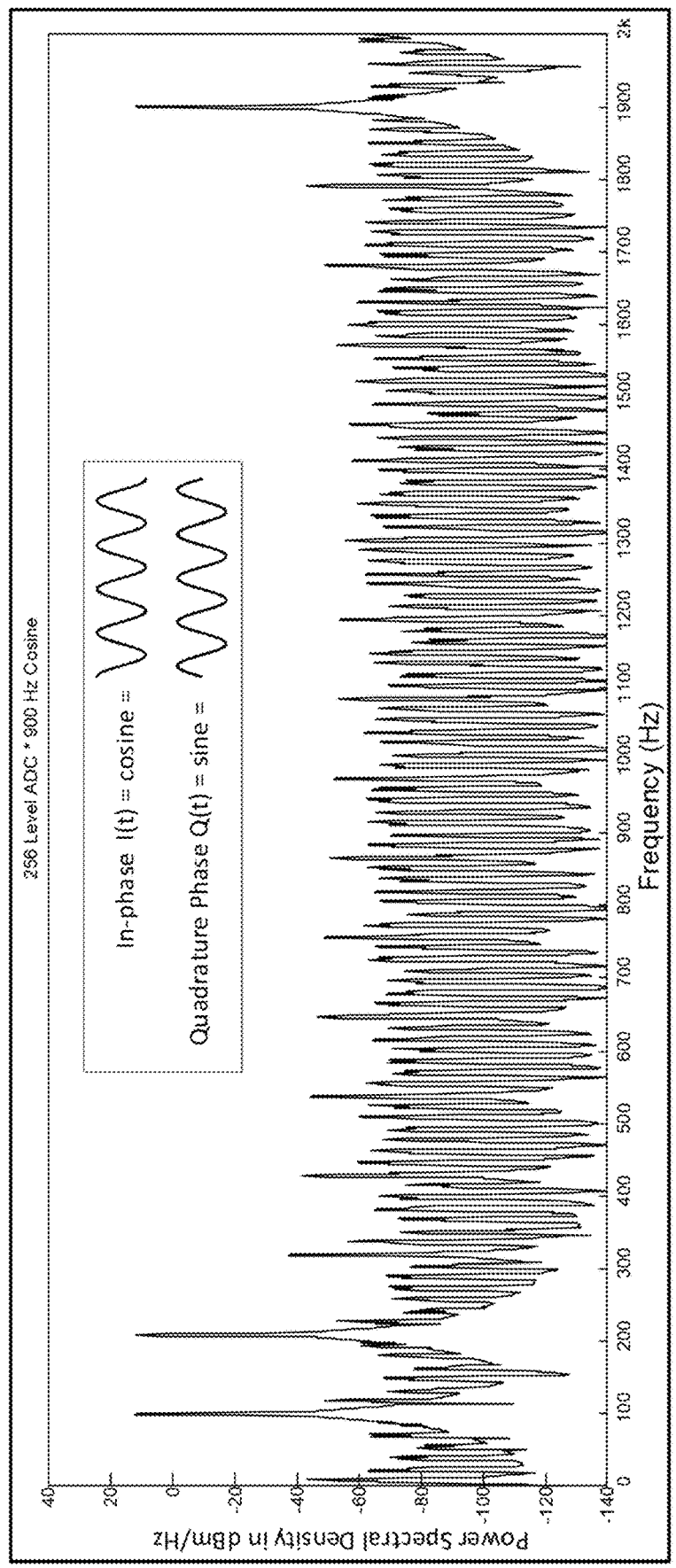
FIGS. 14A-14B are graphs illustrating simulations for I/Q=cosine/sine quadrature signals of a pipeline level crossing ADC in accordance with an example embodiment disclosed herein.
Figure 14B:
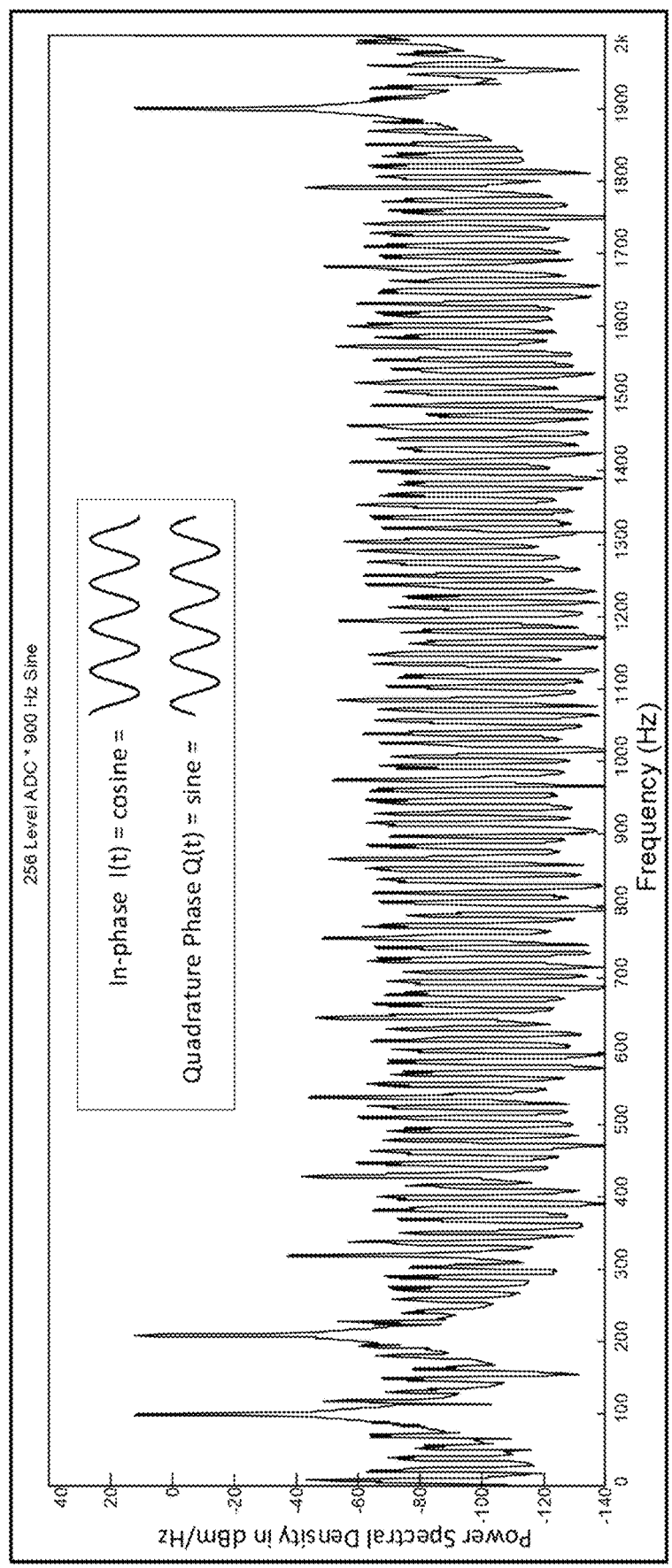

FIGS. 14A and 14B show continuous time software reconfigurable radio simulations using a continuous time complex downconverter (cosine/sine in-phase and quadrature phase sine waves). A 256 level, level crossing ADC was used for the simulations. Input signals are 1.0 kHz and 1.11 kHz sine waves, respectively. I/Q (In-phase/Quadrature phase) modulator is a 0.9 kHz complex sine wave. Frequency down conversion for I/Q channels is shown. Tones at present at 100 Hz and 211 Hz.

Figure 15A:
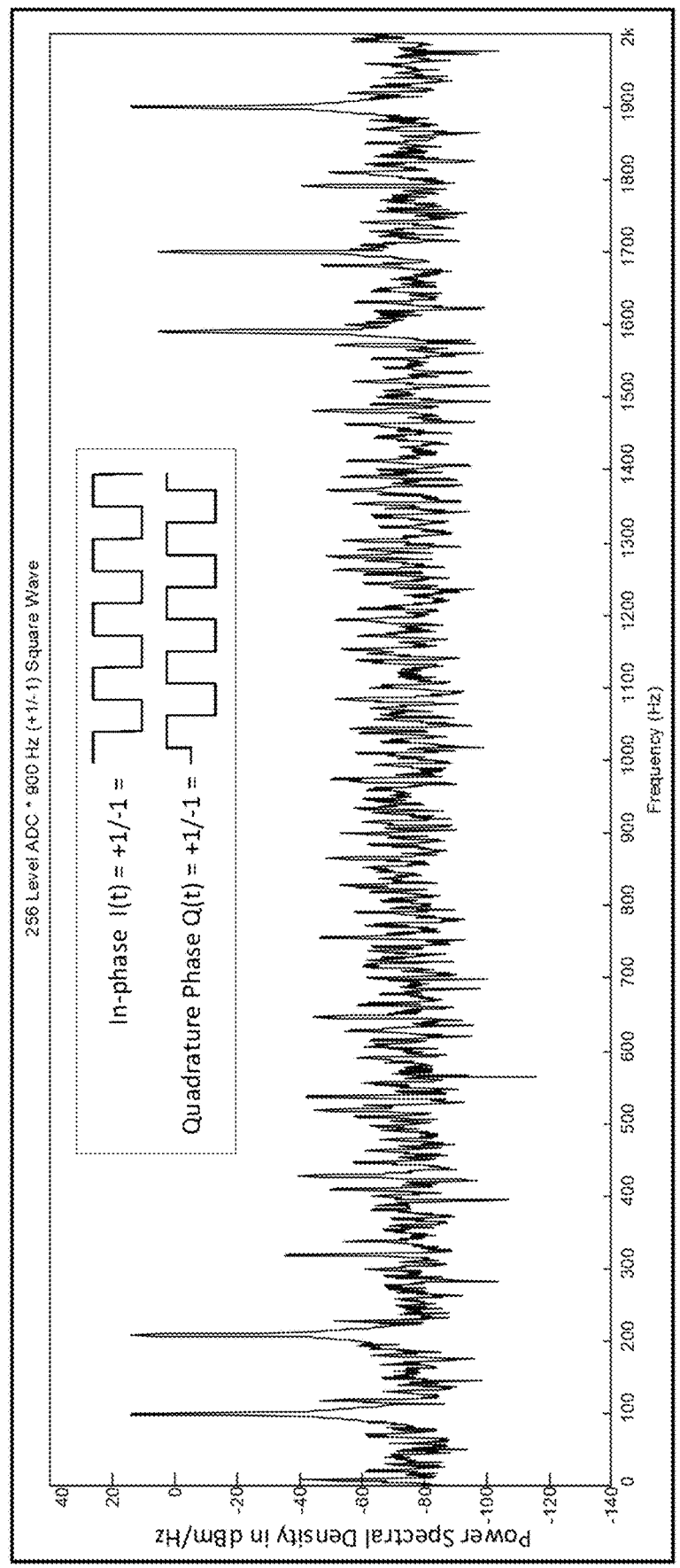
FIGS. 15A-15B are graphs illustrating simulations for simulation for I/Q=+1/−1 quadrature square wave signals of a pipeline level crossing ADC in accordance with an example embodiment disclosed herein.
Figure 15B:
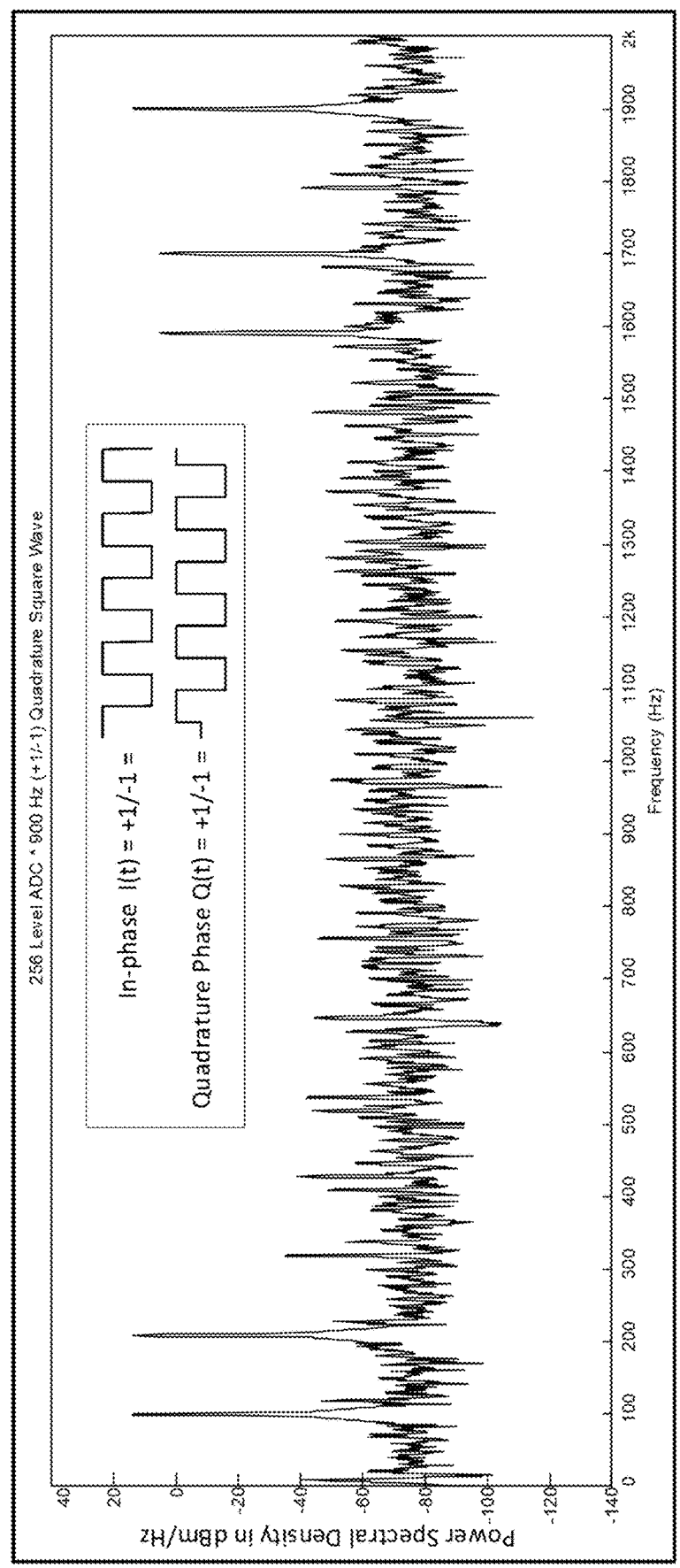

FIGS. 15A and 15B show continuous time software reconfigurable radio simulations using a continuous time complex downconverter (+1/−1 in-phase and quadrature phase square waves). A 256 level, level crossing ADC was used for the simulations. Input signals are 1.0 kHz and 1.11 kHz sine waves, respectively. I/Q modulator is a 0.9 kHz complex square wave. Frequency down conversion for I/Q channels is shown. Tones are present at 100 Hz and 211 Hz and two image frequencies are present at 1.6 kHz and 1.71 kHz. Continuous time+1/−1 in-phase and quadrature phase square waves are simple to generate. The complex square wave down conversion provides the same performance as complex sine wave down conversion. The image frequencies are far removed from the baseband signals.

Figure 16A:
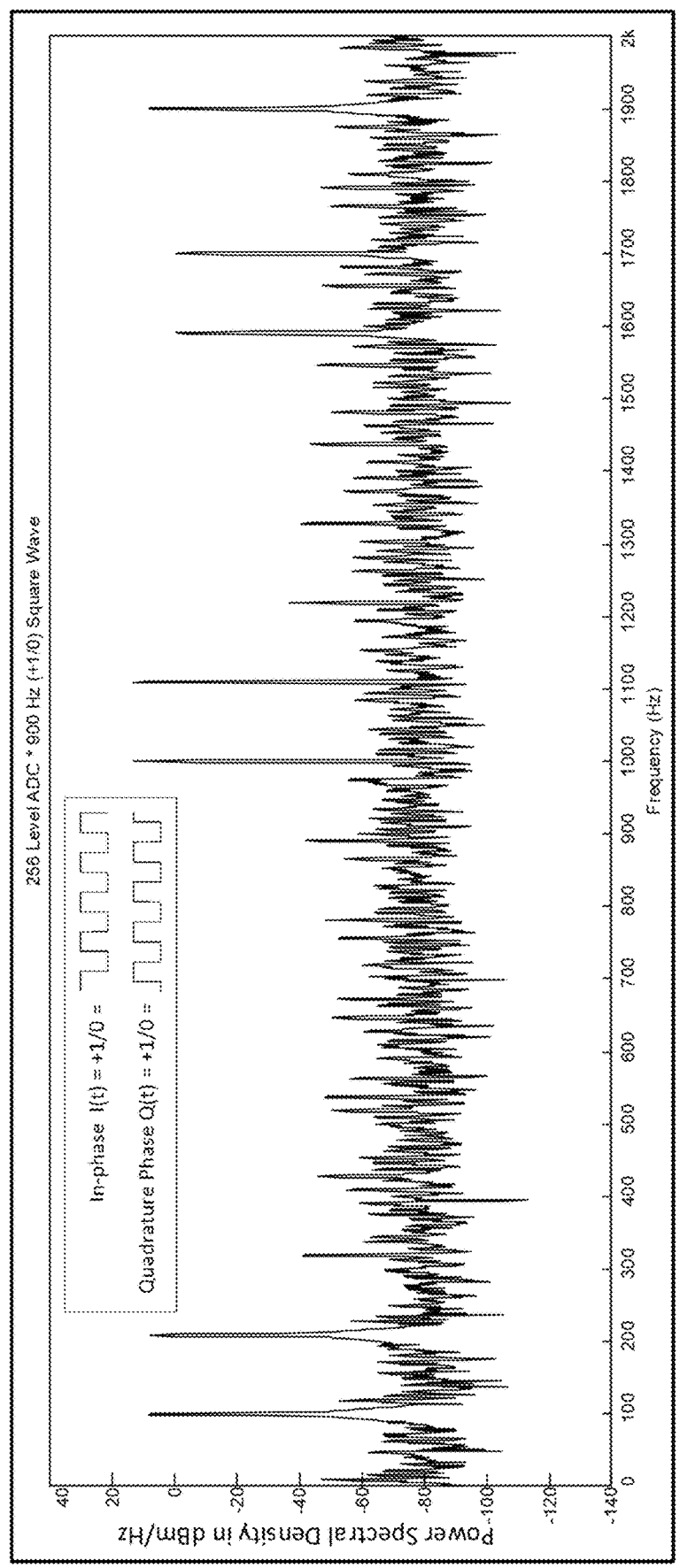
FIGS. 16A-16B are graphs illustrating simulations for I/Q=+1/0 quadrature square wave signals of a pipeline level crossing ADC in accordance with an example embodiment disclosed herein.
Figure 16B:
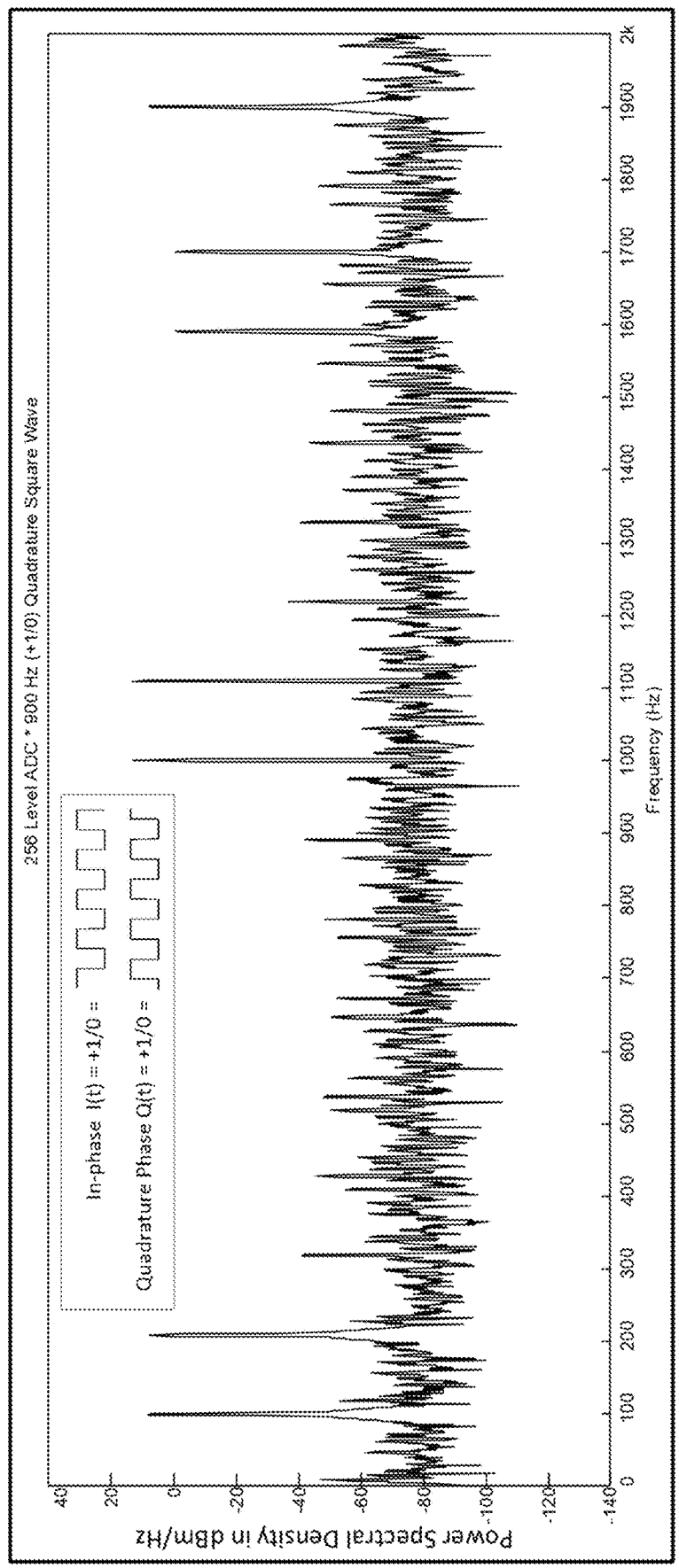

FIGS. 16A and 16B show continuous time software reconfigurable radio simulation using a continuous time complex downconverter (+1/0 in-phase and quadrature phase square waves). I/Q modulator is a 0.9 kHz complex square wave. Frequency down conversion for I/Q channels is shown. Tones at present at 100 Hz and 211 Hz. There are image frequencies at 1.0 kHz, 1.1 kHz, 1.6 kHz and 1.7 kHz. The image frequencies at 1.0 kHz and 1.1 kHz are not being canceled by the +I/O complex square wave multiplier compared to the simulations shown in FIGS. 14A and 14B. The +I/O complex square wave is simpler compared to a complex +1/−1 square wave; however, it suffers from additional image frequencies.

Figure 17A:
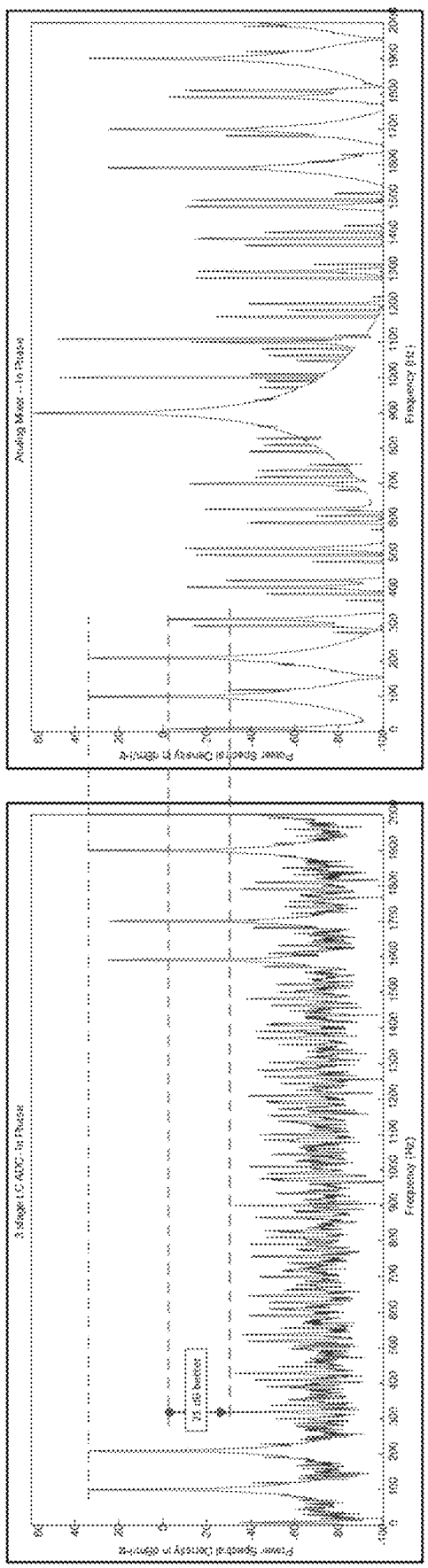
FIGS. 17A-17B are graphs illustrating Simulated Comparisons of software defined radios with continuous time, pipeline level crossing ADCs, in accordance with example embodiments disclosed herein, to conventional software defined radios.
Figure 17B:
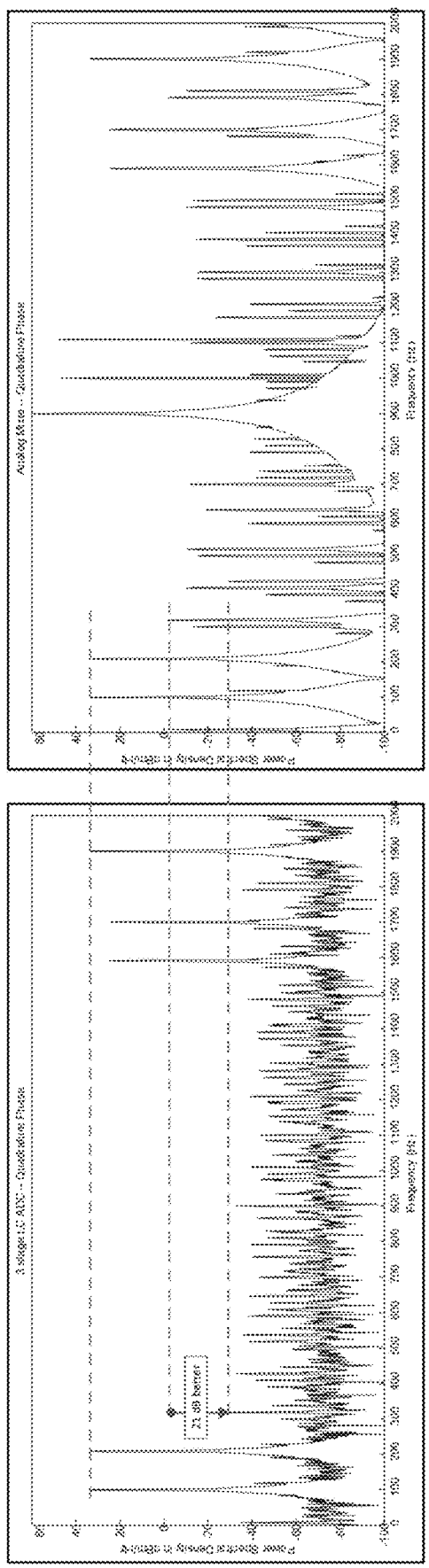

FIGS. 17A and 17B show simulations of a continuous time software defined radio using a continuous time pipelined 3-stage level crossing ADC (equivalent to a 512 level, level crossing ADC). Stages 1, 2, and 3, which are in accordance with the embodiment 1100 of FIG. 11, comprise 10, 8, and 8 comparators, respectively. Performance is compared to the performance of a "comparable" prior art analog mixer front end SDR; the performance of the prior art analog mixer front end SDR also being illustrated in FIGS. 17A and 17B for comparison. FIGS. 17A and 17B demonstrate a significant intermodulation distortion performance improvement for the continuous time SDR and continuous time pipeline level crossing ADC in accordance to the embodiments disclosed herein. The prior art analog mixer results in poor intermodulation distortion. FIGS. 17A and 17B show a potential 21 dB improvement in intermodulation distortion over the prior art.

The properties of the un-clocked pipeline level crossing ADCs disclosed herein overcome time delay and amplitude limitations present in prior art pipeline ADCs. The amplitude and timing corrections are much simpler for the embodiments disclosed herein. Since only one level in a single pipeline stage can change at a time, no timing corrections may actually be required. Amplitude compensation for the stage gain blocks is required; however, gain calibration is simple compared to timing error compensation.

Prior art pipeline flash ADCs suffer from timing and amplitude errors. Complex amplitude error corrections, timing error corrections, and calibration are required. The continuous time pipeline level crossing ADCs disclosed herein only allow a single level crossing to occur at a time. Referring to the continuous time pipeline LC ADCs 1000 and 1100 illustrated in FIGS. 10 and 11, each pipeline stage uses the same resistor ladder voltages. The amplifier circuits 1006 or those having gains Gsg1 through Gsg(N−1), place the difference or error voltage in between two coarse levels 801; thereby preventing stage voltage levels from overlapping. FIG. 11 illustrates an n-stage pipeline.

Prior art SRR are limited by: (1) poor intermodulation distortion; (2) a more complicated down conversion signal chain; and (3) poor performance under strong signals, jamming, and impulse noise. Prior art SDR using conventional pipelined analog-to-digital converters suffer from amplitude and time delay errors from the structure of the analog-to-digital converter. Prior art pipelined ADC errors are significant when the input signal crosses a boundary between pipeline stages causing multiple simultaneous bit changes.

The continuous time software defined radio 1300 offers significantly improved performance over the prior art software reconfigurable radio 1200. A continuous time software defined radio 1300 with a continuous time pipelined level crossing ADC, such as the continuous time pipeline LC ADCs 1000 and 1100, offers the follow advantages: (1) Significantly improved intermodulation distortion; (2) Simpler digital down conversion (frequency translation). Continuous time ADC's output can be multiplied by +1/−1 in phase and quadrature phase square waves for frequency translation (FIGS. 15A and 15B); (3) a continuous time ADC can only change one level at a time (FIGS. 8-9); (4) better front-end signal processing performance using simpler hardware; and (5) better performance under strong signals, jamming, and impulse noise conditions.

Here multiple examples have been given to illustrate various features and are not intended to be limiting. Any one or more of the features may not be limited to the particular examples presented herein, regardless of any order, combination, or connections described, unless specifically stated otherwise. In fact, it should be understood that any combination of the features and/or elements described by way of example above are contemplated, including any variation or modification which is not enumerated, but capable of achieving the same. Unless otherwise stated, any one or more of the features may be combined in any order.

As above, figures are presented herein for illustrative purposes and are not meant to impose any structural limitations, unless otherwise specified. Various modifications to any of the structures shown in the figures are contemplated to be within the scope of the embodiments disclosed herein. The embodiment or the embodiments disclosed herein refers to subject matter in the present application that is not prior art and is intended to support the claims.

Although in the illustrated examples herein the voltage of the input signal is used as the measurement quantity of the input signal for signal processing purposes, it should be understood that the measurement quantity of the input signal may be any one or more of the group of measurement quantities consisting of a voltage, a current, a charge, a flux, and any other electrical measurement quantity.

Where "coupling" or "connection" is used, unless otherwise specified, no limitation is implied that the coupling or connection be restricted to a physical coupling or connection and, instead, should be read to include communicative couplings, including wireless transmissions and protocols.

Where conditional language is used, including, but not limited to, "can," "could," "may" or "might," it should be understood that the associated features or elements are not required. As such, where conditional language is used, the elements and/or features should be understood as being optionally present in at least some examples, and not necessarily conditioned upon anything, unless otherwise specified.

Where lists are enumerated in the alternative or conjunctive (e.g. one or more of A, B, and/or C), unless stated otherwise, it is understood to include one or more of each element, including any one or more combinations of any number of the enumerated elements (e.g. A, AB, AC, ABC, ABB, etc.). When "and/or" is used, it should be understood that the elements may be joined in the alternative or conjunctive.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A signal processing subsystem for processing an input signal having a measurement quantity, the signal processing subsystem comprising:
   a plurality of N stages, where $N \geq 2$, each stage n (for $1 \leq n \leq N$) being configured to receive the input signal and corresponding reference levels for the measurement quantity, and to output an output code based on comparison between the input signal and reference levels;
   a summing circuit configured to sum together the output codes from every stage n to provide a digital output code that approximates the measurement quantity of the input signal;
   an amplifier circuit for the last stage, the amplifier circuit configured to receive the error voltage from the preceding stage, scale up the error voltage by a factor of $M_{N-1}$, and output the scaled-up error voltage;
   wherein each of the corresponding plurality of reference voltage levels received by the last stage is supplied to a first input of a corresponding comparator of the last stage, and the scaled-up error voltage is supplied to a second input of each comparator of the last stage;
   a code converter circuit that receives the outputs of the comparators and converts them into the output code for the last stage, the output code coding for one of (a) a factor of $1/M_{N-1}$ multiplied by the highest reference level that does not exceed the scaled-up error voltage, or (b) a factor of $1/M_{N-1}$ multiplied by the nearest reference level to the scaled-up error voltage, wherein rounding is performed if the error voltage is equidistant between two reference levels.

2. A signal processing subsystem for processing an input signal having a measurement quantity, the signal processing subsystem comprising:
   a plurality of N stages, where $N \geq 2$, each stage n (for $1 \leq n \leq N$) being configured to receive the input signal and corresponding reference levels for the measurement quantity, and to output an output code based on comparison between the input signal and reference levels;
   a summing circuit configured to sum together the output codes from every stage n to provide a digital output code that approximates the measurement quantity of the input signal;
   a voltage selector circuit for each stage n, for $2 \leq n \leq N-1$, configured to receive the output code from stage n and output a voltage given by $m\Delta/M_{N-1}$, where m is the number of the highest reference level at stage n that does not exceed the scaled-up error voltage from the preceding stage;
   wherein the output voltage from each voltage selector circuit is used by a corresponding summing circuit to compute the error voltage for that stage, thereby allowing each stage to refine the approximation of the measurement quantity.

3. A signal processing subsystem for processing an input signal having a measurement quantity, the signal processing subsystem comprising:
   a plurality of N stages, where $N \geq 2$, each stage n (for $1 \leq n \leq N$) being configured to receive the input signal and corresponding reference levels for the measurement quantity, and to output an output code based on comparison between the input signal and reference levels;
   a summing circuit configured to sum together the output codes from every stage n to provide a digital output code that approximates the measurement quantity of the input signal;
   a voltage selector circuit for each stage n, for $2 \leq n \leq N-1$, configured to receive the output code from stage n and output a voltage given by $m\Delta/M_{n-1}$, where m is the number of the highest reference level at stage n that does not exceed the scaled-up error voltage from the preceding stage;
   a summing circuit for each stage n, for $2 \leq n \leq N-1$, configured to receive the output voltage from the voltage selector circuit of each preceding stage, and to sum the negative of the voltage selector circuit output signal from each stage and the input signal, generating the error voltage for each stage to be processed by the subsequent stage.

4. A signal processing subsystem for processing an input signal having a measurement quantity, the signal processing subsystem comprising:
   a plurality of N stages, where N=2, each stage being configured to receive the input signal and corresponding reference levels for the measurement quantity, and to output an output code based on comparison between the input signal and reference levels;
   a summing circuit configured to sum together the output codes from the two stages to provide a digital output code that approximates the measurement quantity of the input signal;
   a voltage selector circuit for the first stage, configured to receive the output code from the first stage and output a first stage voltage given by $m\Delta$, where m is the number of the highest reference level at the first stage that does not exceed the input signal;
   a summing circuit for the first stage that computes the error voltage by subtracting the output voltage from the input signal;
   an amplifier circuit for the second stage that receives the error voltage from the first stage, scales it up by a factor of M, and outputs the scaled-up error voltage;
   a code converter circuit for the second stage, configured to receive the outputs of the comparators and convert them into the output code for the second stage, the output code coding for one of (a) a factor of 1/M multiplied by the highest reference level that does not exceed the scaled-up error voltage, or (b) a factor of 1/M multiplied by the nearest reference level to the scaled-up error voltage, wherein rounding is performed if the error voltage is equidistant between two reference levels.

* * * * *